United States Patent
Tran

(10) Patent No.: US 11,011,531 B2
(45) Date of Patent: May 18, 2021

(54) REPLACEMENT CONTROL GATE METHODS AND APPARATUSES

(71) Applicant: Micron Technology, Inc., Boise, ID (US)

(72) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/555,046

(22) PCT Filed: Mar. 16, 2016

(86) PCT No.: PCT/US2016/022672
§ 371 (c)(1),
(2) Date: Aug. 31, 2017

(87) PCT Pub. No.: WO2016/149389
PCT Pub. Date: Sep. 22, 2016

(65) Prior Publication Data
US 2018/0040624 A1      Feb. 8, 2018

Related U.S. Application Data

(60) Provisional application No. 62/134,338, filed on Mar. 17, 2015.

(51) Int. Cl.
*H01L 27/11556* (2017.01)
*H01L 21/02* (2006.01)
(Continued)

(52) U.S. Cl.
CPC .. *H01L 27/11556* (2013.01); *H01L 21/02244* (2013.01); *H01L 27/1157* (2013.01);
(Continued)

(58) Field of Classification Search
CPC ............. H01L 29/7889; H01L 29/7883; H01L 27/11556; H01L 27/11582
See application file for complete search history.

(56) References Cited

U.S. PATENT DOCUMENTS 8,187,936 B2 *  5/2012  Alsmeier .......... H01L 27/11551
                                                      257/324
8,697,498 B2     4/2014  Jang et al.
(Continued)

FOREIGN PATENT DOCUMENTS

| CN | 102959693 | 3/2013 |
| CN | 107534045 | 1/2018 |
| WO | WO-2016149389 A1 | 9/2016 |

OTHER PUBLICATIONS

"International Application Serial No. PCT/US2016/022672, International Preliminary Report on Patentability dated Sep. 28, 2017", 14 pgs.
(Continued)

*Primary Examiner* — Phat X Cao
*Assistant Examiner* — Diana C Vieira
(74) *Attorney, Agent, or Firm* — Schwegman Lundberg & Woessner, P.A.

(57) ABSTRACT

Disclosed are memory structures and methods for forming such structures. An example method forms a vertical string of memory cells by forming an opening in interleaved tiers of dielectric tier material and nitride tier material, forming a charge storage material over sidewalls of the opening and recesses in the opening to form respective charge storage structures within the recesses. Subsequently, and separate from the formation of the floating gate structures, at least a portion of the remaining nitride tier material is removed to produce control gate recesses, each adjacent a respective charge storage structure. A control gate is formed in each control gate recess, and the control gate is separated from the charge storage structure by a dielectric structure. In some examples, these dielectric structures are also formed separately from the charge storage structures.

18 Claims, 35 Drawing Sheets

(51) Int. Cl.

| | | |
|---|---|---|
| | *H01L 27/11524* | (2017.01) |
| | *H01L 29/423* | (2006.01) |
| | *H01L 29/788* | (2006.01) |
| | *H01L 27/11582* | (2017.01) |
| | *H01L 27/1157* | (2017.01) |
| | *H01L 27/11565* | (2017.01) |
| | *H01L 21/28* | (2006.01) |

(52) U.S. Cl.
CPC .. *H01L 27/11524* (2013.01); *H01L 27/11565* (2013.01); *H01L 27/11582* (2013.01); *H01L 29/40114* (2019.08); *H01L 29/42328* (2013.01); *H01L 29/7883* (2013.01)

(56) References Cited

U.S. PATENT DOCUMENTS

| | | |
|---|---|---|
| 8,759,895 B2 | 6/2014 | Tang et al. |
| 2012/0001250 A1 | 1/2012 | Alsmeier |
| 2012/0003828 A1 | 1/2012 | Chang et al. |
| 2012/0068241 A1 | 3/2012 | Sakuma et al. |
| 2012/0292686 A1 | 11/2012 | Son et al. |
| 2012/0326221 A1 | 12/2012 | Sinha |
| 2013/0217221 A1* | 8/2013 | Prindle ............ H01L 21/28114 438/595 |
| 2014/0003148 A1 | 1/2014 | Sun et al. |
| 2014/0063890 A1 | 3/2014 | Lee et al. |

OTHER PUBLICATIONS

"International Application Serial No. PCT/US2016/022672, International Search Report dated Jul. 11, 2016", 5 pgs.

"International Application Serial No. PCT/US2016/022672, Written Opinion dated Jul. 11, 2016", 14 pgs.

Jang, J., et al., "Vertical cell array using TCAT(Terabit Cell Array Transistor) technology for ultra high density NAND flash memory", Symposium on VLSI Technology, (2009), 192-193.

"Chinese Application Serial No. 201680024216.9, Office Action dated Feb. 3, 2020", w English Translation, 49 pgs.

"Chinese Application Serial No. 201680024216.9, Office Action dated Sep. 4, 2020", w English translation, 18 pgs.

* cited by examiner

REPLACEMENT CONTROL GATE METHODS AND APPARATUSES

PRIORITY APPLICATIONS

This application is a U.S. National Stage Application under 35 U.S.C. 371 from International Application No. PCT/US2016/022672, filed Mar. 16, 2016, which claims the benefit of priority to U.S. Provisional Application Ser. No. 62/134,338, filed Mar. 17, 2015, all of which are incorporated herein by reference in their entirety.

BACKGROUND

Memory devices can be provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile (e.g., flash) memory.

Flash memory devices typically use a one-transistor memory cell that may allow for high memory densities, high reliability, and low power consumption. Changes in threshold voltage of the memory cells, through programming of a charge storage structure such as floating gates, trapping layers or other physical phenomena, may determine the data state of each cell.

The memory cells may be arranged in strings of memory cells where each string may be coupled between a drain and a common source. Relatively recently, memory cell strings are being fabricated vertically in order to fit more memory cells on a semiconductor memory device and thereby increase the memory density of memory devices.

Many conventional processes of fabricating vertical strings of memory cells may result in various problems, including residual nitride remaining in undesirable locations when "flanking" (e.g., U-shaped) nitride results from the fabrication process. It would be desirable to improve the vertical memory cell string fabrication process to yield an improved cell architecture

DETAILED DESCRIPTION

The present description addresses a representative semiconductor fabrication process for forming a memory device including vertical strings of memory cells; and particularly wherein the memory cells have "replacement" control gates. For purposes of the present description, the term "replacement control gate" refers to a control gate of a charge storage access device that is fabricated after the charge storage structure has been fabricated. For purposes of the example structure used herein to describe an example manufacturing process flow, the charge storage structure will be a floating gate transistor, and the access gate of the transistor will be formed after formation of the floating gate. Some process flows in accordance with the teachings herein may avoid the creation of a flank (U-shaped) nitride structure that essentially surrounds the charge storage structure, as is produced with some conventional process flows.

In the following description various terms are used to describe the relative placement or orientation of structures. The term "horizontal" as used in this description is refers to a plane parallel to the conventional plane or surface of a substrate, such as that underlying a wafer or die, regardless of the actual orientation of the substrate at any point in time. The term "vertical" refers to a direction generally perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on"(in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation. Similarly, identification of two structures being "adjacent" is meant to describe a general proximity to one another (within the context of the dimensions of the structures described herein), and does not suggest either the presence or absence of any intervening materials or structures (in other words two nearby structures are adjacent within the meaning of this description whether they are in contact with one another, or separated by an intervening structure).

Figure 1:
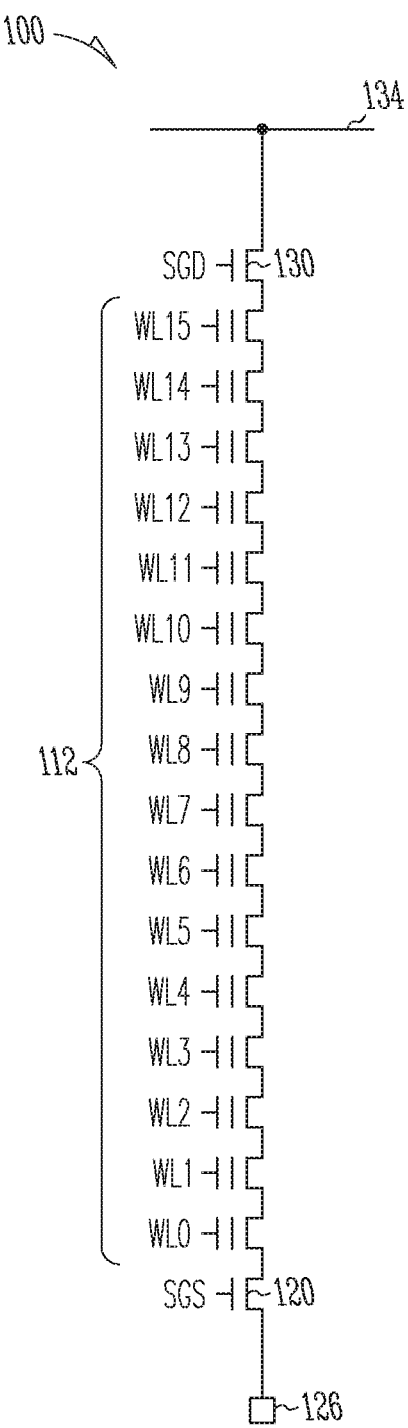
FIG. 1 illustrates a schematic diagram of an apparatus comprising a string of memory cells, according to various embodiments.

FIG. 1 depicts a schematic representation of an apparatus comprising a string 100 of memory cells, according to various embodiments. For purposes of illustration only, the string 100 is shown having 16 memory cells 112. Alternate embodiments can include more or less than 16 memory cells 112. In this example, the string 100 includes a source select gate transistor 120 (e.g., SGS, n-channel) where the source select gate transistor 120 is coupled between one of the memory cells 112 at one end of the string 100 and a common source 126. The common source 126 may comprise, for example, a slot of commonly doped semiconductor material and/or other conductive material. The common source 126 may be common to one or more additional strings of memory cells that together form a memory array or device, or a portion thereof.

At an opposite end of the string 100, a drain select gate transistor 130 (e.g., SGD, n-channel) includes a transistor 130 coupled between one of the memory cells 112 (in this example, located at the opposite end of string 100), and a data line (e.g., bit line) 134. In some examples, the data line 134 may also be common to one or more additional strings of memory cells in the memory array or device.

In this example, each of the memory cells 112 includes a charge storage structure. In the examples discussed herein the charge storage structure will be described as a floating gate transistor; though other charge storage mechanisms may be used instead, such as, for example, a charge trap transistor, or other forms of charge storage mechanisms. The memory cells 112 may be configured to be either a single level charge storage device (SLC) or multilevel charge storage device (MLC), with double or triple (or more) levels of charge storage capability.

In the depicted example, the memory cells 112, the source select gate transistor 120, and the drain select gate transistor 130 will be controlled by signals on their respective control gates. In an embodiment, the control gates of memory cells 112 in a row of memory cells can form part of an access line (e.g., word line) WL0-WL15. The signals to control the memory cells 112 may be provided on their respective access line.

The source select gate transistor 120 may receive a control signal that controls the source select gate transistor 120 to substantially control conduction between the string 100 and the common source 126. The drain select gate transistor 130 may receive a control signal that controls the drain select gate transistor 130, so that the drain select gate transistor 130 can be used to select or deselect the string 100.

The string 100 can be one of multiple strings of memory cells 112 in a block of memory cells in a memory device, such as a NAND-architecture flash memory device. Each string 100 of memory cells 112 may be formed vertically such that they extend outward from a substrate as opposed to being disposed in a planar manner along the surface of the substrate. Other embodiments may use other types of memory architecture such as, for example, NOR flash memory architecture.

FIGS. 2-34 depict a representative portion of a memory array at a respective processing stage in an example semiconductor fabrication process for constructing vertical strings of memory cells having replacement control gates. The figures depict the fabrication of multiple vertical strings of memory cells. The described fabrication process may be used to fabricate any number of vertical strings of memory cells in a memory array or device.

In the embodiments of FIGS. 2-34, the drain select gate and source select gate transistors are shown being fabricated with the same flow process that forms the memory cells of the vertical string of memory cells. However, other embodiments may fabricate the drain select gate transistor and/or the source select gate transistor at different times from the flow shown in FIGS. 2-34. For example, the source select gate transistor may be fabricated prior to the fabrication flow shown in FIGS. 2-34. Similarly, the drain select gate transistor may be fabricated at the same time as the rest of the vertical string of memory cells or it may be fabricated after the vertical string of memory cells.

Figure 2:
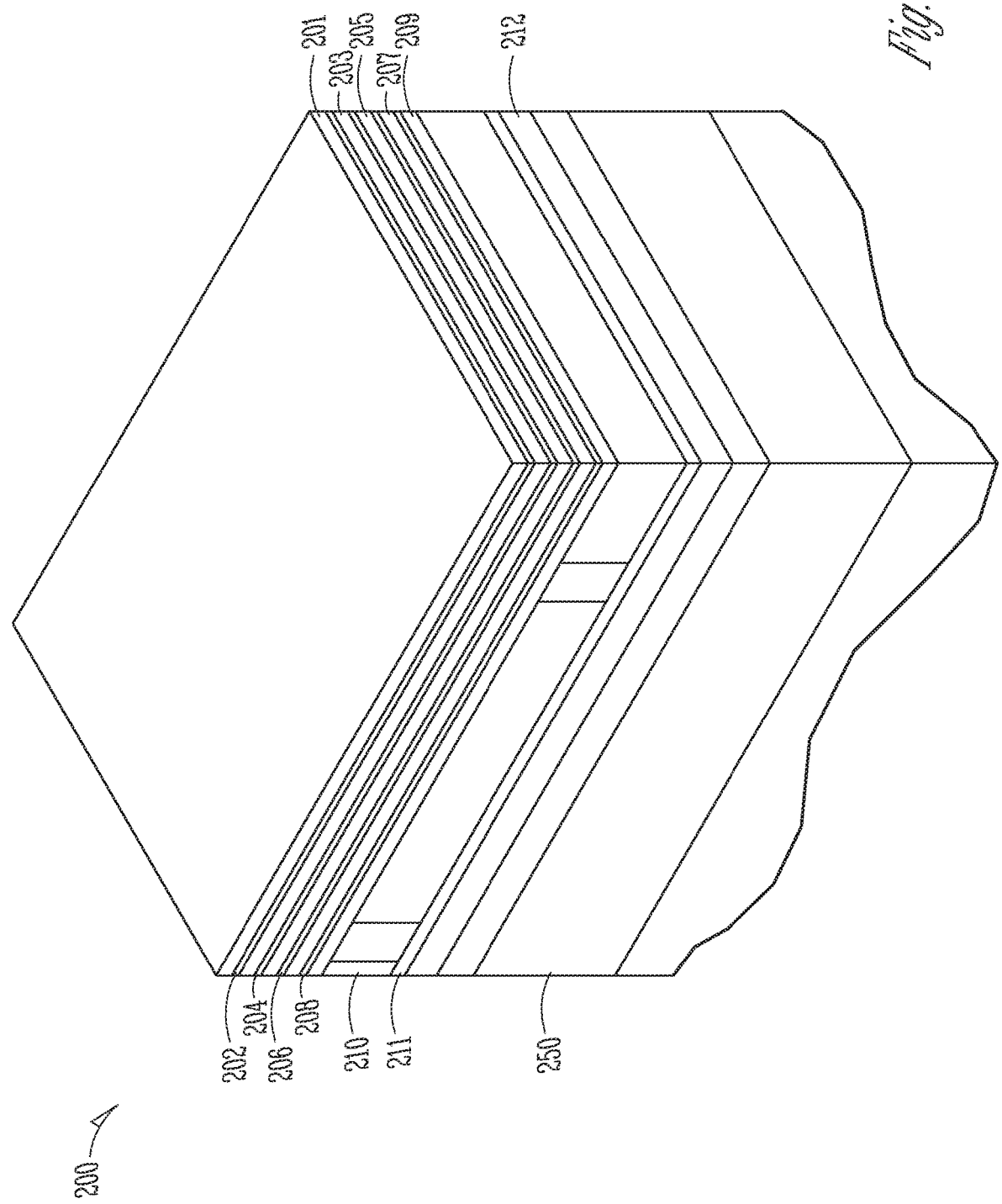
FIGS. 2-34 each depict a representative portion of a memory array at a respective processing stage in an example semiconductor fabrication process for constructing vertical strings of memory cells having replacement control gates; with FIGS. 2-21 and 23-34 illustrated from an oblique perspective, and FIG. 21, depicted from an upper, plan, perspective.

Referring to FIG. 2, a stack 200 of interleaved tiers of semiconductor materials 201-209 is formed (e.g., deposited) on the source select gate material 210. The semiconductor materials may include tiers of a dielectric material (e.g., for example an oxide material) (termed herein as "dielectric material" tiers) 201, 203, 205, 207, 209 which are vertically spaced from one another in the stack, and separated from one another, at least in part by tiers of a barrier material, such as a nitride-containing material 202, 204, 206, 208 (e.g., termed herein either "barrier material" tiers or "nitride material" tiers). This relationship of the tiers is referred to herein as "interleaved" tiers. For purposes of simplifying the present example, a limited number of dielectric material tiers and nitride material tiers are depicted in the referenced Figures. In most cases, an actual device would include additional pairs of both types of tiers; and would include at least a dielectric material tier and a nitride material tier for each memory cell to be formed in the vertical string (i.e., the interleaved tier stack 200 to construct the memory cell portion of a vertical string as discussed in reference to FIG. 1, structure would include at least 16 dielectric material tiers, with at least 16 barrier material tiers interleaved therewith).

The dielectric material tiers 201, 203, 205, 207, 209 include, in this example, silicon dioxide ($SiO_2$); or may include other low trapping oxide materials, such as those having a lower dielectric constant than that of $SiO_2$ (e.g., 3.9). Also, in this example, the nitride material tiers 202, 204, 206, 208 include, for example, silicon nitride ($Si_3N_4$), titanium nitride (TiN), tantalum nitride (TaN), other nitride materials; or may include other materials that may be relatively easily removable and selectively removable relative to the oxide layers 201, 203, 204, 207. While in some examples, and as depicted in FIG. 2, stack 200 may include a vertical section in which dielectric material tiers and nitride material tiers are formed directly one upon the other; such structure is not required and other material layers, such as other electrically insulating layers or similar structures may be vertically interspersed between the described interleaved dielectric material tiers and nitride material tiers.

In the depicted example, the dielectric material tiers 201, 203, 205, 207, 209 are formed having a greater thickness than the nitride material tiers 202, 204, 206, 208. For example, the dielectric material tiers 201, 203, 205, 207, 209 may be formed to a thickness of a range of about 35-40 nanometers (nm) while the nitride material tiers 202, 204, 206, 208 may be formed to a thickness of a range of about 15-20 nm. These thicknesses are for purposes of illustration only as the disclosed embodiments are not limited to any particular thicknesses.

The dielectric material tiers 201, 203, 205, 207, 209 can also be or include, for example, a relatively low leakage, high-K (e.g., greater than 3.9) dielectric material. For example, these tiers 201, 203, 205, 207, 209 may include hafnium dioxide ($HfO_2$) or zirconium dioxide ($ZrO_2$).

If the source select gate transistor is being fabricated with the flow of FIGS. 2-34, the interleaved tier stack 200 may be formed (e.g., deposited) above the SGS material 210 (e.g., polysilicon). The SGS material 210 may be formed over an isolating dielectric material 211 (e.g., oxide) that may serve to isolate the SGS material 210 from the common source node material 212, as well as other from layers of the semiconductor structures or the substrate 250 (e.g., bulk silicon).

Figure 3:
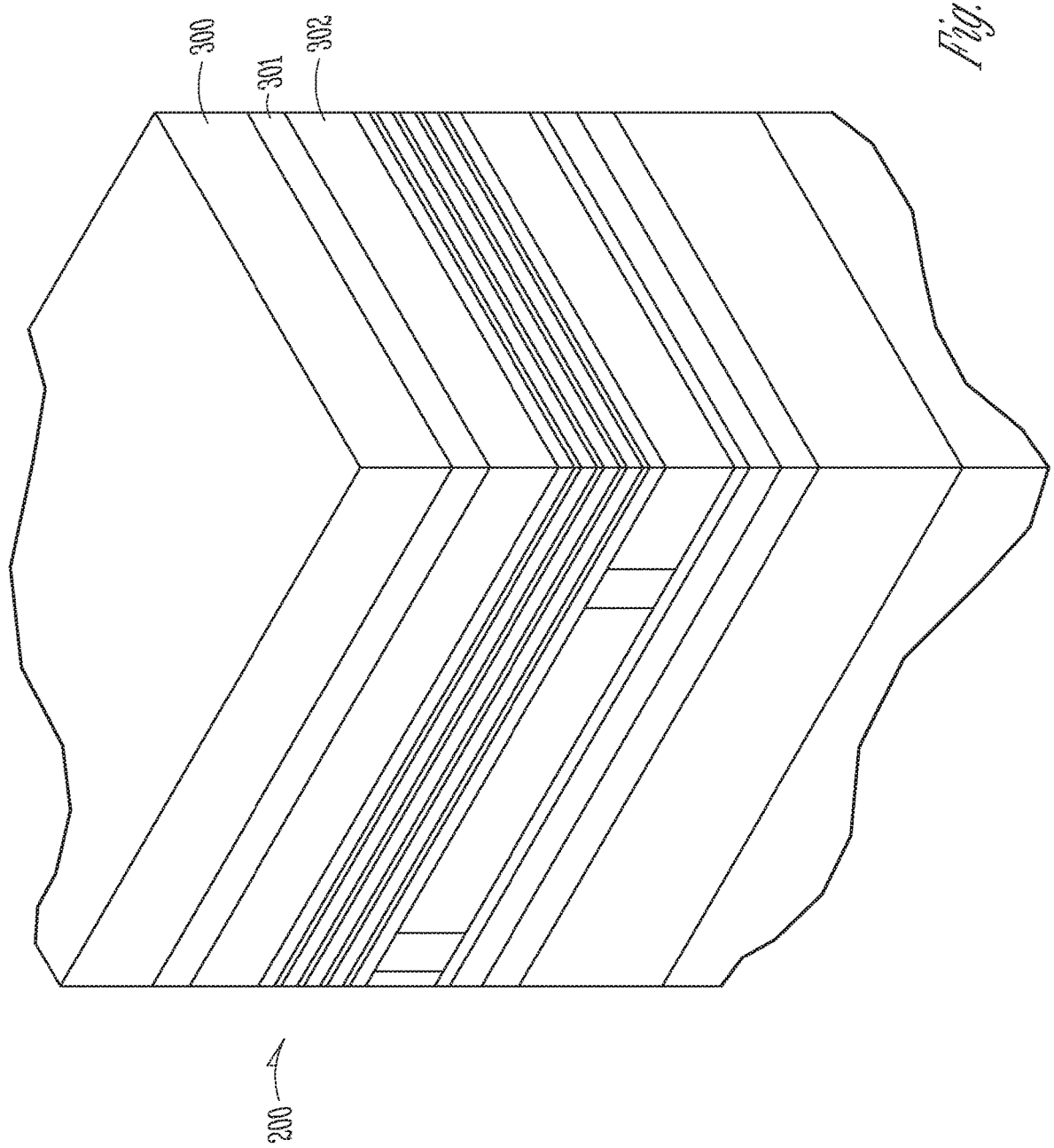

FIG. 3 depicts one option for a subsequent stage of the three-dimensional view of semiconductor fabrication flow providing additional structures relative to those described and discussed in reference to FIG. 2. In this example, the drain select gate transistor for the vertical array of memory cells will be fabricated with the rest of the vertical string of memory cells, and thus the SGD material 302 is formed (e.g., deposited) over the interleaved tier stack 200. In an embodiment, the SGD material 302 is a polysilicon.

A cap dielectric material 301 (e.g., oxide) may be formed over the SGD material 302. A patterned hard mask 300 (pattern not depicted) may be formed (e.g., deposited) over the SGD material 302. If the drain select gate transistor is fabricated after the rest of the vertical string of memory cells, the patterned hard mask 300 may be formed over the interleaved tier stack 200. The patterned hard mask 300 may be used as an etch resistant material during a subsequent etching process. The patterned hard mask 300 may be, for example, an amorphous carbon, undoped polysilicon hard mask or some other etch resistant material. While the drain select gate transistors may be formed separately from the further processing of the tier stack 200; for purposes of describing the example processing flow surrounding stack 200, subsequent FIGS. 4-34 and accompanying discussion will describe a process flow which includes forming of the drain select gate transistors with processing of the stack, as indicated by this FIG. 3.

Figure 4:
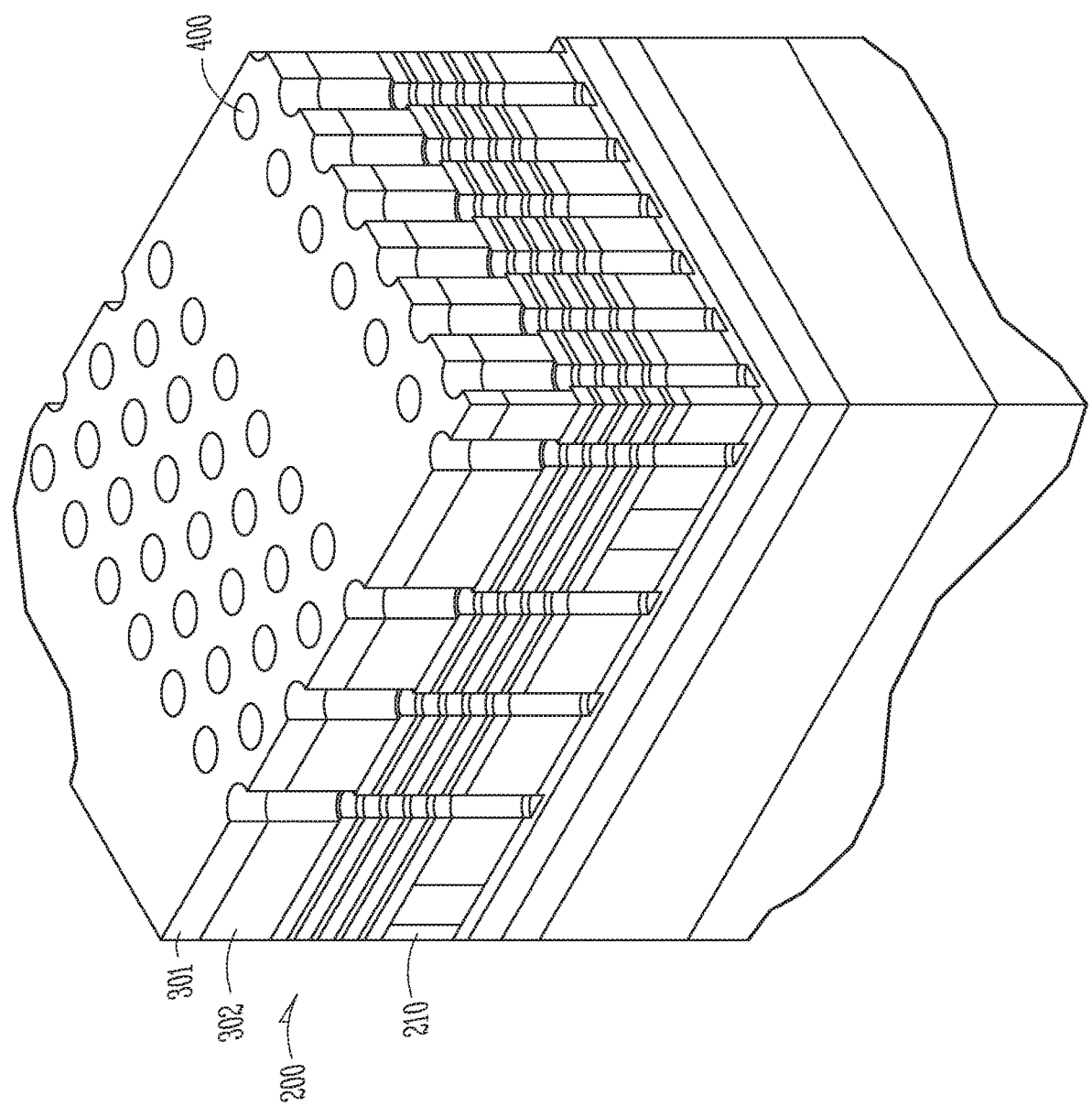

FIG. 4 depicts the structure of FIG. 3 after the patterned mask layer 300 of that figure has been utilized to form openings 400 (e.g., by etching through the cap oxide 301, the SGD material 302, the interleaved tier stack 200, and the SGS material 210). The openings 400 will, in subsequent processes, contain the respective pillars for each of the vertical strings of memory cells.

The openings 400 may be etched using reactive ion etch (RIE) techniques, which will typically be preferred as opposed to wet chemical etches. The etch process may be more or less non-isotropic (directional) so that, in an embodiment, the sides of the openings are substantially close to forming an angle of 90° with respect to the substrate surface. In another embodiment, the sides may have some slope and the slope may vary along the depth of the pillar opening. In many example, the openings may have a depth in a range of about 1 µm to about 5 µm, as measured from the surface or layer 301, depending on the number of cells in the string being integrated. Of course, greater depths are possible where the structure is to include a greater number of memory cells in the vertical string.

Figure 5:
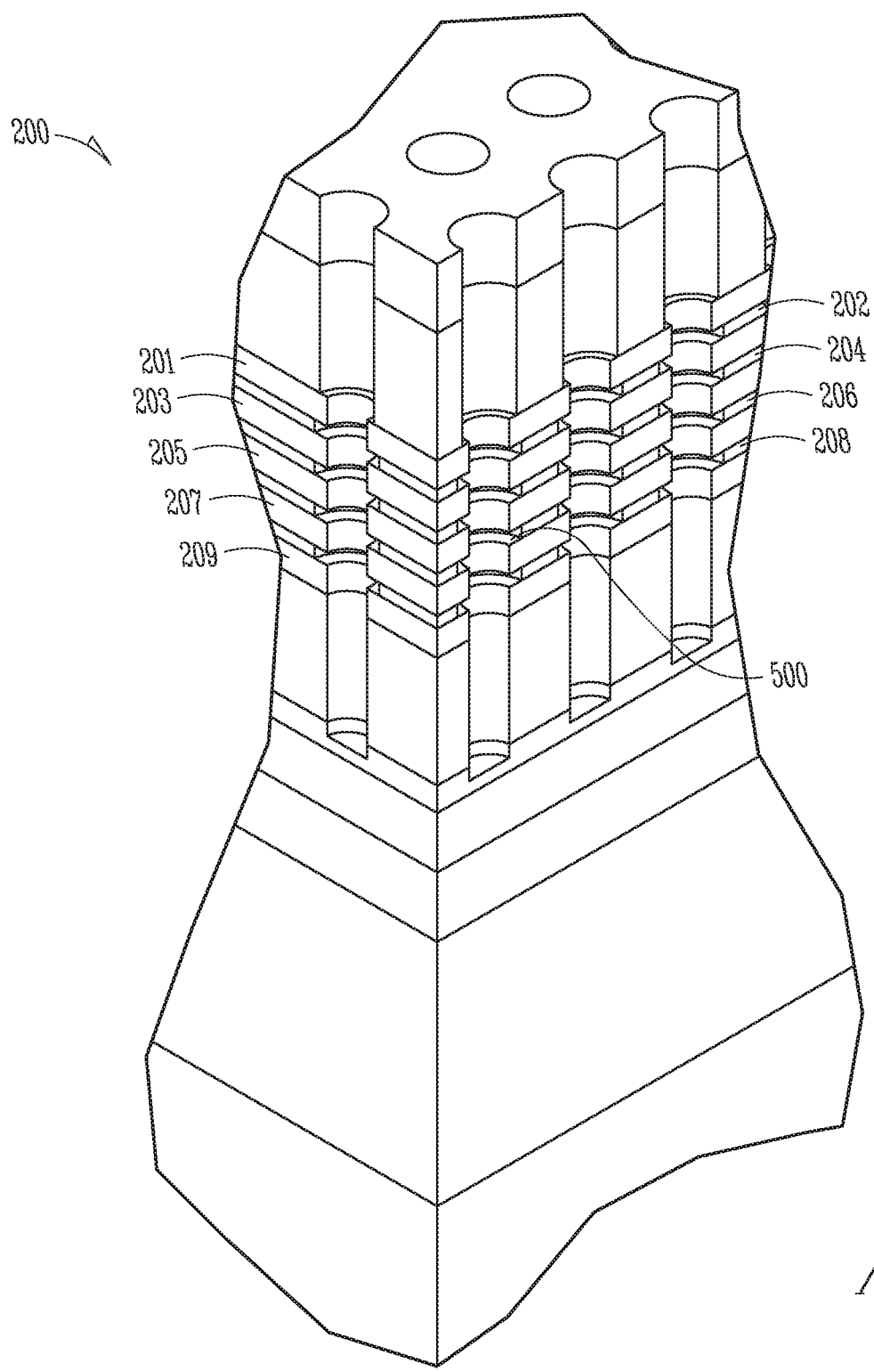

FIG. 5 depicts the structure of FIG. 4 after forming of lateral recesses 500 in the nitride material tiers 202, 204, 206, 208 of the interleaved tier stack 200. The recesses 500 each surround a respective opening 400. Each recess 500 may be formed to be approximately equal to a thickness of a charge storage material (in this example, a floating gate structure) that will subsequently be formed in the recesses 500. For example, the recesses may be formed to a range of about 10-20 nm.

The recesses 500 may be formed by a selective, isotropic etch process. For example, a vapor etch may be used to etch the nitride material tiers 202, 204, 206, 208 laterally while not etching the dielectric material tiers 201, 203, 205, 207, 209. Such an etch process may include a wet or chemical etch process.

Figure 6:
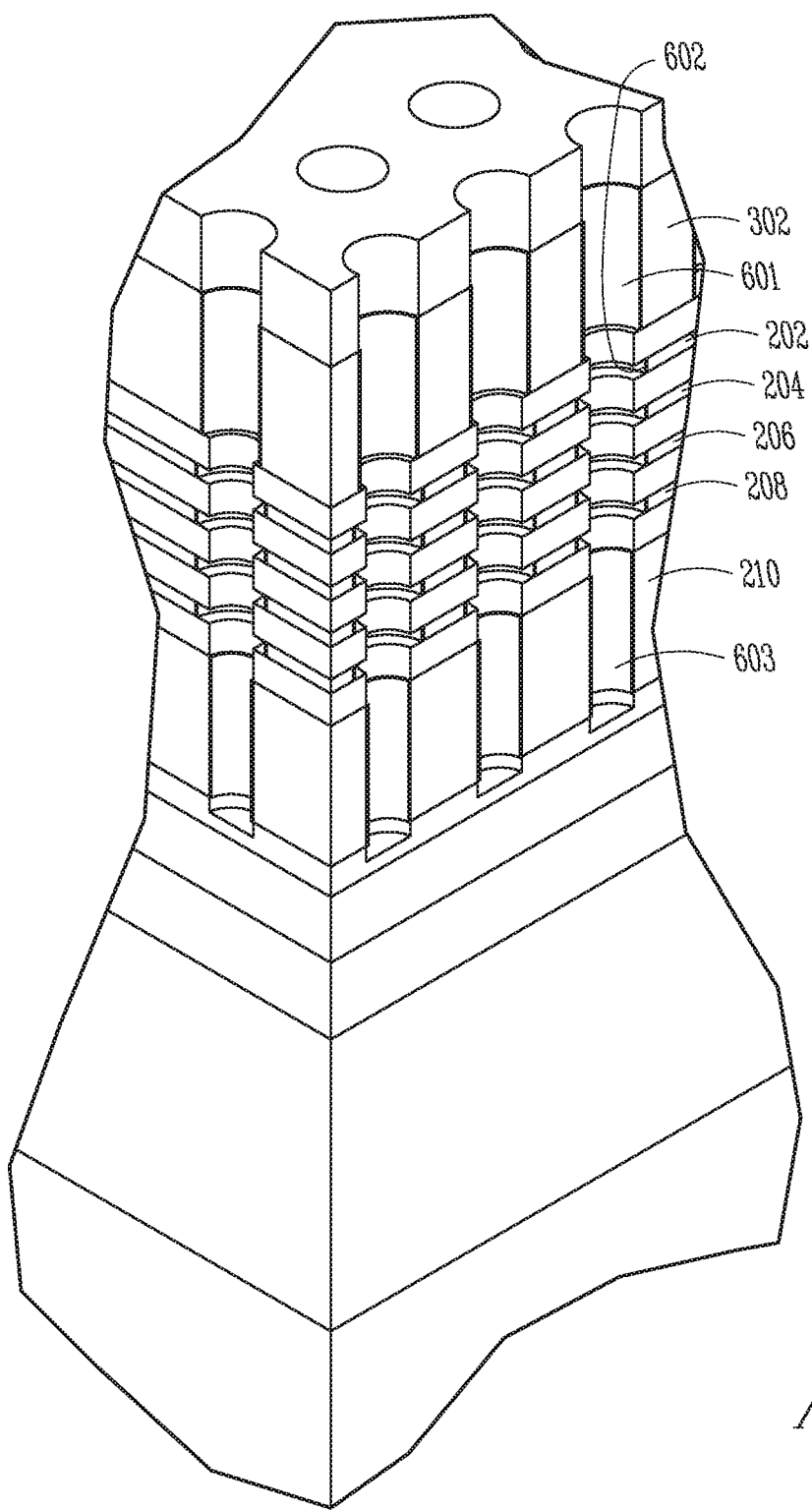

FIG. 6 depicts the structure of FIG. 5 after forming of a liner dielectric 602 (e.g., oxide) over the nitride material tiers 202, 204, 206, 208 in the recesses 500. The liner dielectric 602 may be relatively thin (e.g., approximately 15 Angstroms (Å)), functioning to isolate the nitride material tiers 202, 204, 206, 208 from a subsequently formed floating gate material (e.g., polysilicon). The liner dielectric 602 may be formed by an oxidation process (e.g., grown) or a deposition process.

If the SGD and SGS transistors are formed in the same flow as illustrated in FIGS. 2-34, a liner dielectric 601, 603 may be formed, in the same step as the liner dielectric 602, over the respective SGD material 302 and SGS material 210, in order to separate each of the SGS and SGD materials 210, 302, respectively (e.g., in most cases each will include polysilicon) from a subsequent polysilicon forming a pillar in the opening that may have a different doping level and doping type from the SGD and SGS polysilicon 210, 302.

Figure 7:
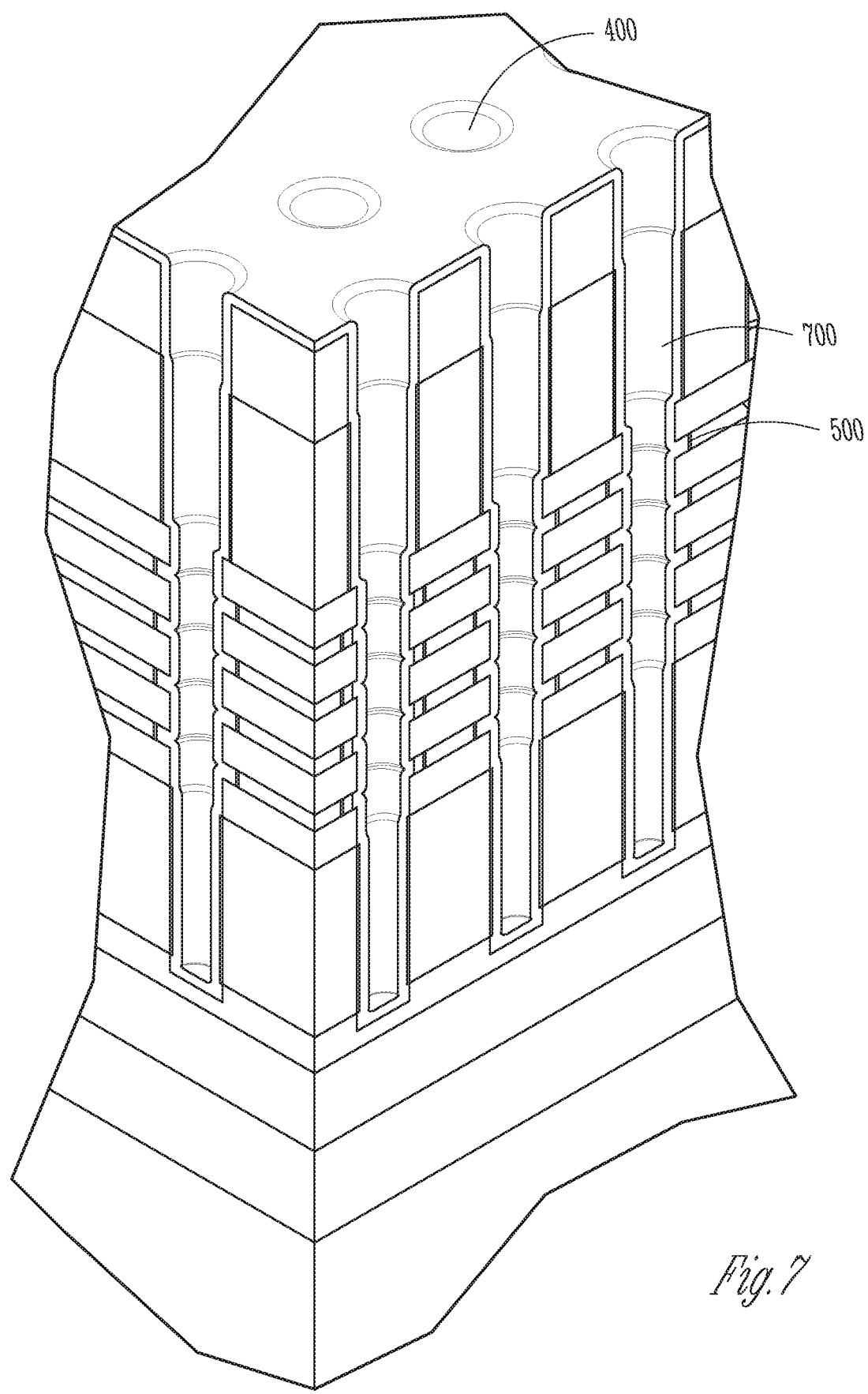

FIG. 7 depicts the structure of FIG. 6 after forming of a floating gate material 700 (e.g., polysilicon), usually by deposition over the sidewalls of each of the openings 400 and in contact with the sidewalls then defining each opening 400 (e.g., adjacent dielectric material tiers), and within the nitride tier recesses 500. The material 700 in the recesses 500 will form the floating gate for each of the memory cells. The floating gate material 700, for example, may be deposited to a depth of approximately greater than the nitride thickness divided by two. For example, the floating gate material may be deposited to a depth of greater than approximately 10 nm on the sidewalls of the openings 400 and recesses 500 such that the floating gate material 700 substantially fills each of the nitride tier recesses 500 by the recess sidewall material joining in the middle of each of the recesses. As discussed previously, the liner dielectric 601-603 separates the floating gate material 700 from the SGD and SGS material as well as the individual nitride material tiers. If the floating gate material 700 is a polysilicon, the polysilicon may be doped or undoped. In another embodiment, the floating gate material may include one or more of a metal, a metal composite, and metal nano dots embedded in a dielectric.

Figure 8:
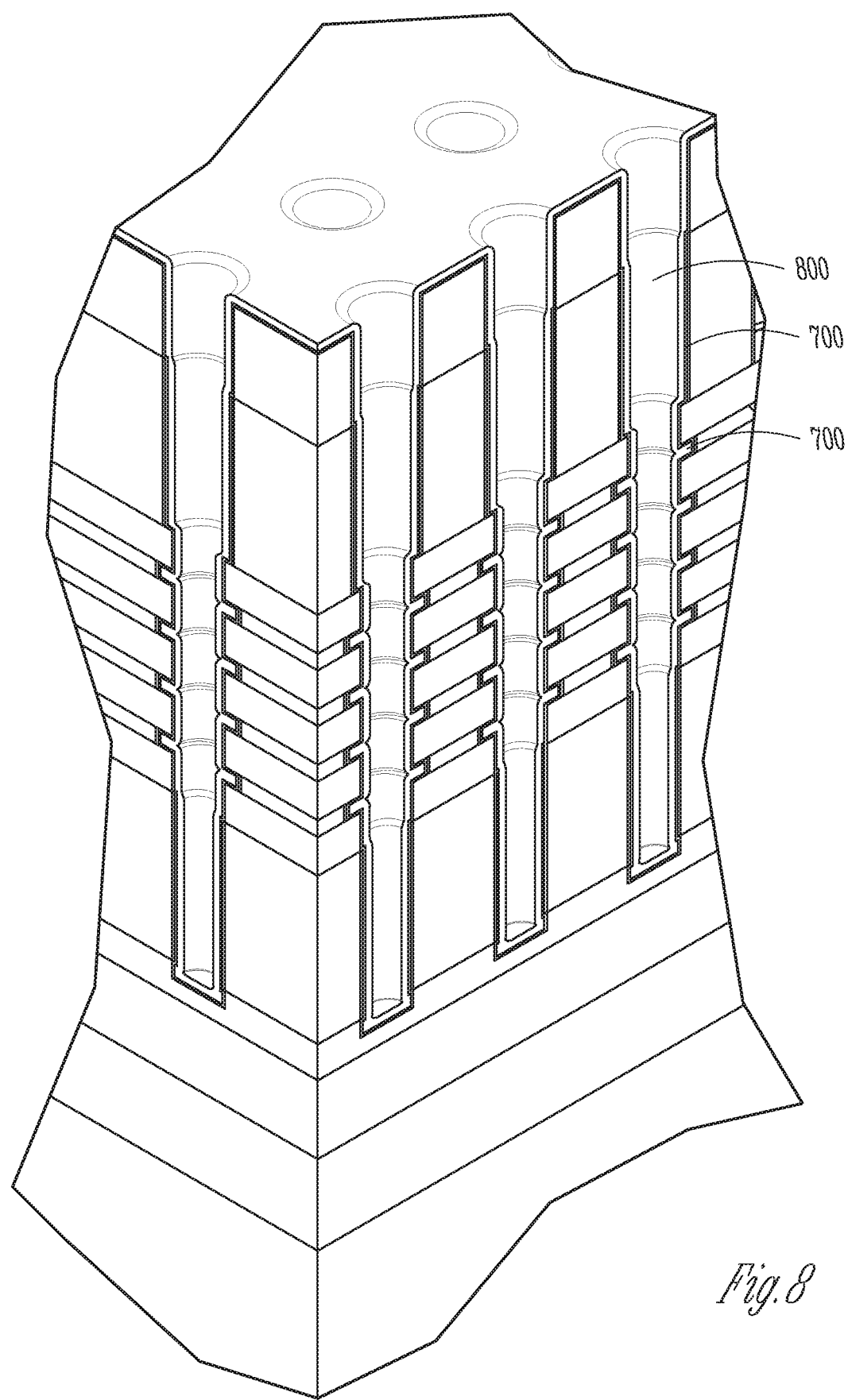

FIG. 8 depicts the structure of FIG. 7 after forming of a partial sacrificial oxide 800 over the floating gate material 700. Partial sacrificial oxide may be formed over the floating gate material 700, preferably by consuming only a particular portion (e.g., less than all) of the underlying floating gate material 700 over the sidewalls. A thickness of the sacrificial oxide 800 is determined such that, when a subsequent etching process is performed to remove the sacrificial oxide 800, only a particular portion (e.g., approximately 7 nm) of the underlying floating gate material 700 is oxidized to become a sacrificial oxide 800 to be removed. The thickness of the sacrificial oxide 800 determines the amount of underlying floating gate material 700 that is removed. For example, making the sacrificial oxide 800 thicker, results in less floating gate material 700 being removed from the sidewalls of the openings during the etching process (e.g., thereby leaving a thicker layer of polysilicon over the sidewalls). Since the remaining floating gate material 700 eventually becomes the tunnel dielectric, as seen in a subsequent flow process, this process also determines the thickness of the tunnel dielectric.

Figure 9:
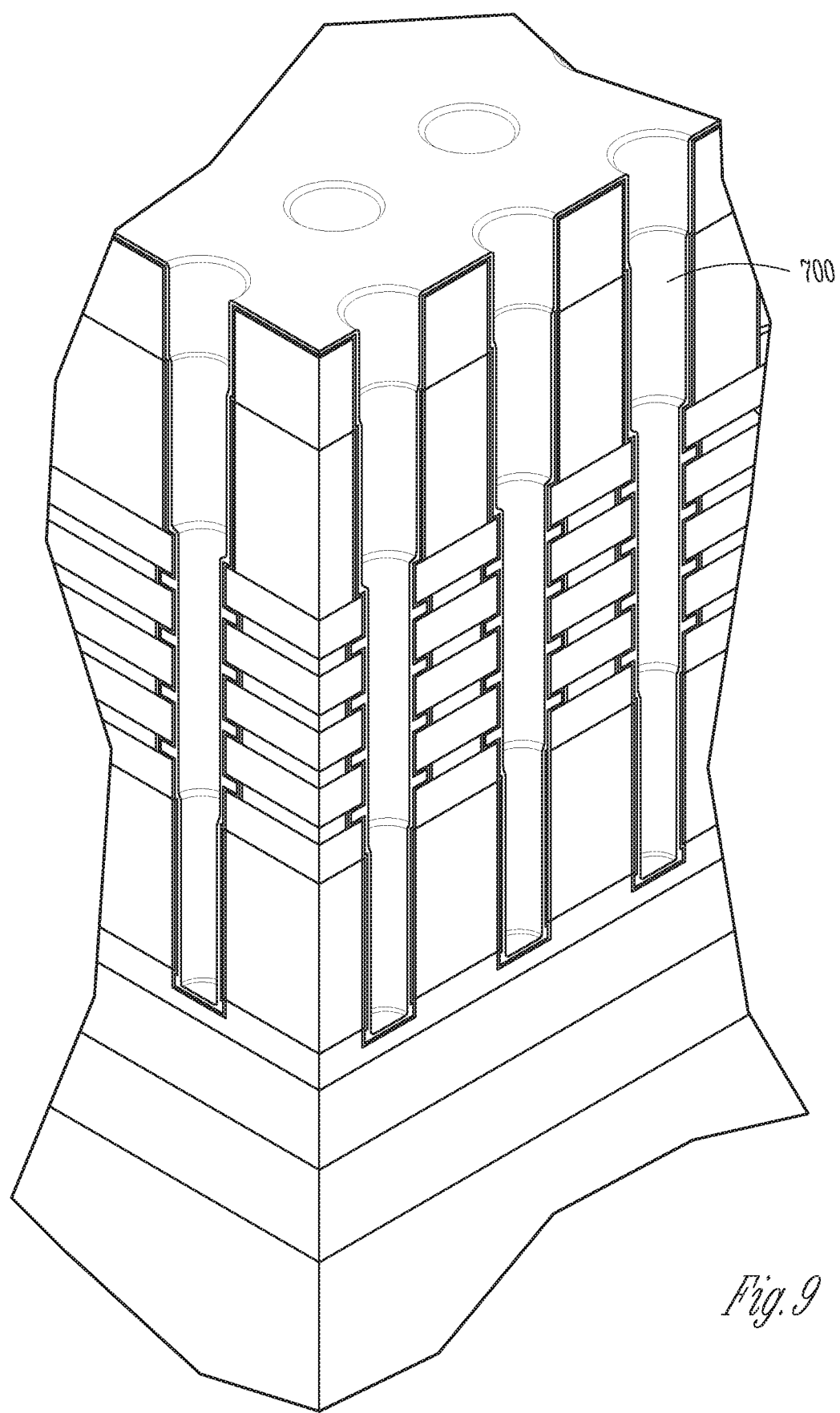

FIG. 9 depicts the structure of FIG. 8 after a partial floating gate poly cut (e.g., etching process) to remove the sacrificial oxide 800. In addition to the floating gate material 700 remaining in the recesses of the openings, a reduced thickness of floating gate material 700 now remains on the sidewalls of the openings 400 (e.g., approximately 30 Å). This material 700 may preserve the pillar cross-sectional diameter through future process steps.

Figure 10:
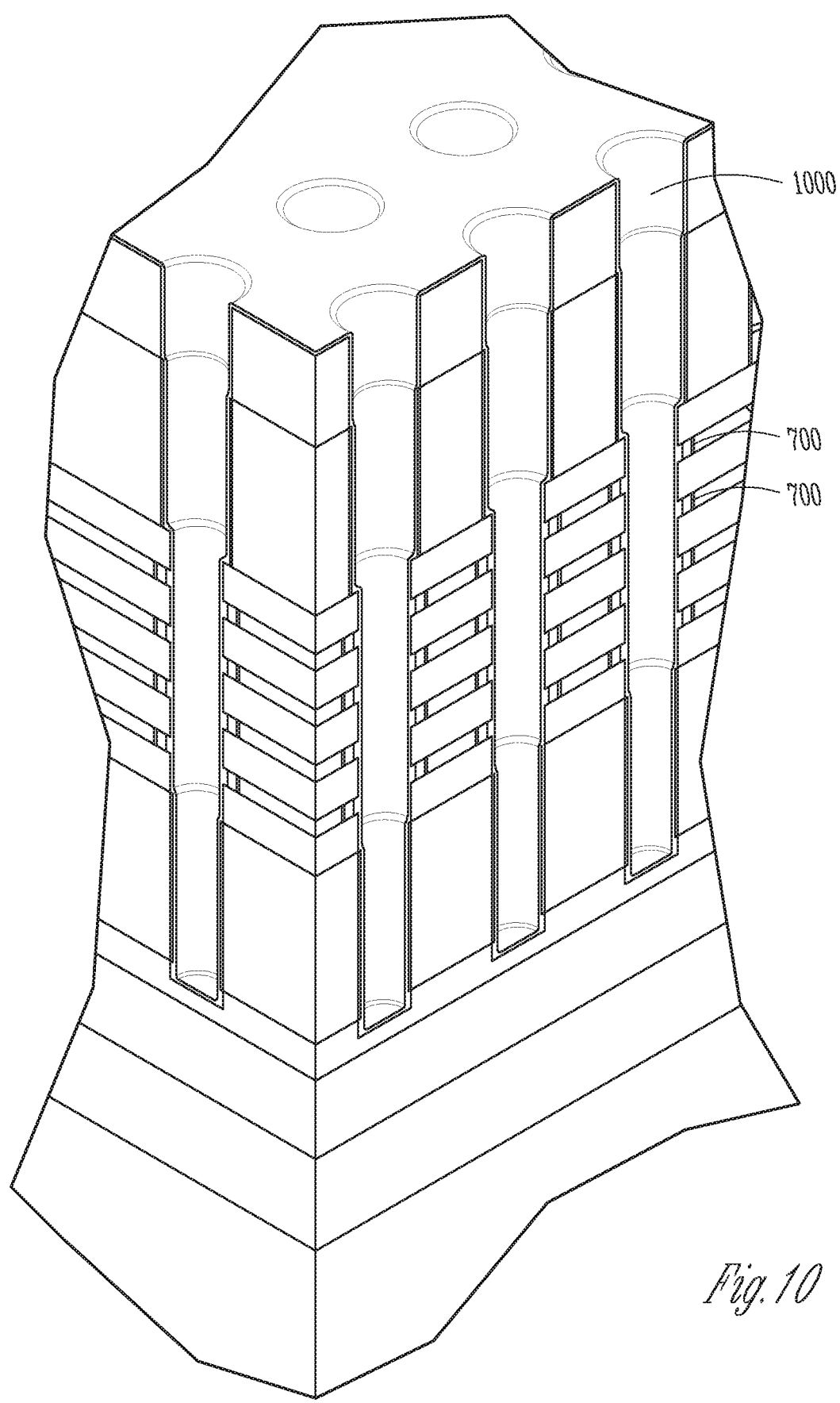

FIG. 10 depicts the structure of FIG. 9 after forming of a tunnel dielectric 1000. Tunnel dielectric material 1000 is formed (e.g., grown), for example, by oxidation of the remaining floating gate material 700 on the sidewalls of the openings. The floating gate material (e.g., polysilicon) on the sidewalls of the openings is consumed by the tunnel oxide growth. This may result in the inner pillar cross-section diameter being reduced by a particular thickness (e.g., about 10-14 nm total). This same tunnel oxide 1000 may be grown on the SGS material 210 and SGD gate to concurrently form the gate dielectric for these respective devices.

The oxidation may have the benefit of resulting in a pure oxide in both the cells and the SGD/SGS gate dielectrics. The oxidation may also reduce tier expansion since the oxidation has minimum encroachment to tier nitride since it oxidizes the sidewall poly initially and consumes the sidewall floating gate material such that only the floating gate material in the nitride material tiers remains. As an alternative to the above flow, however, the sacrificial oxide discussed in reference to FIG. 7 might not be limited to only a portion of the thickness of the polysilicon on the sidewalls, but might be formed to oxidize all polysilicon over the sidewalls, leaving only the portion in the recesses unoxidized to form the floating gate structures therein. In this alternative process, removal of the sacrificial oxide will remove all, or at least most, of the polysilicon over the sidewalls that could have been used for forming a tunnel oxide. As a result, in this alternative process, a tunnel oxide would be deposited over the sidewalls and floating gate structures (rather than being grown from remaining polysilicon, as discussed above)

Figure 11:
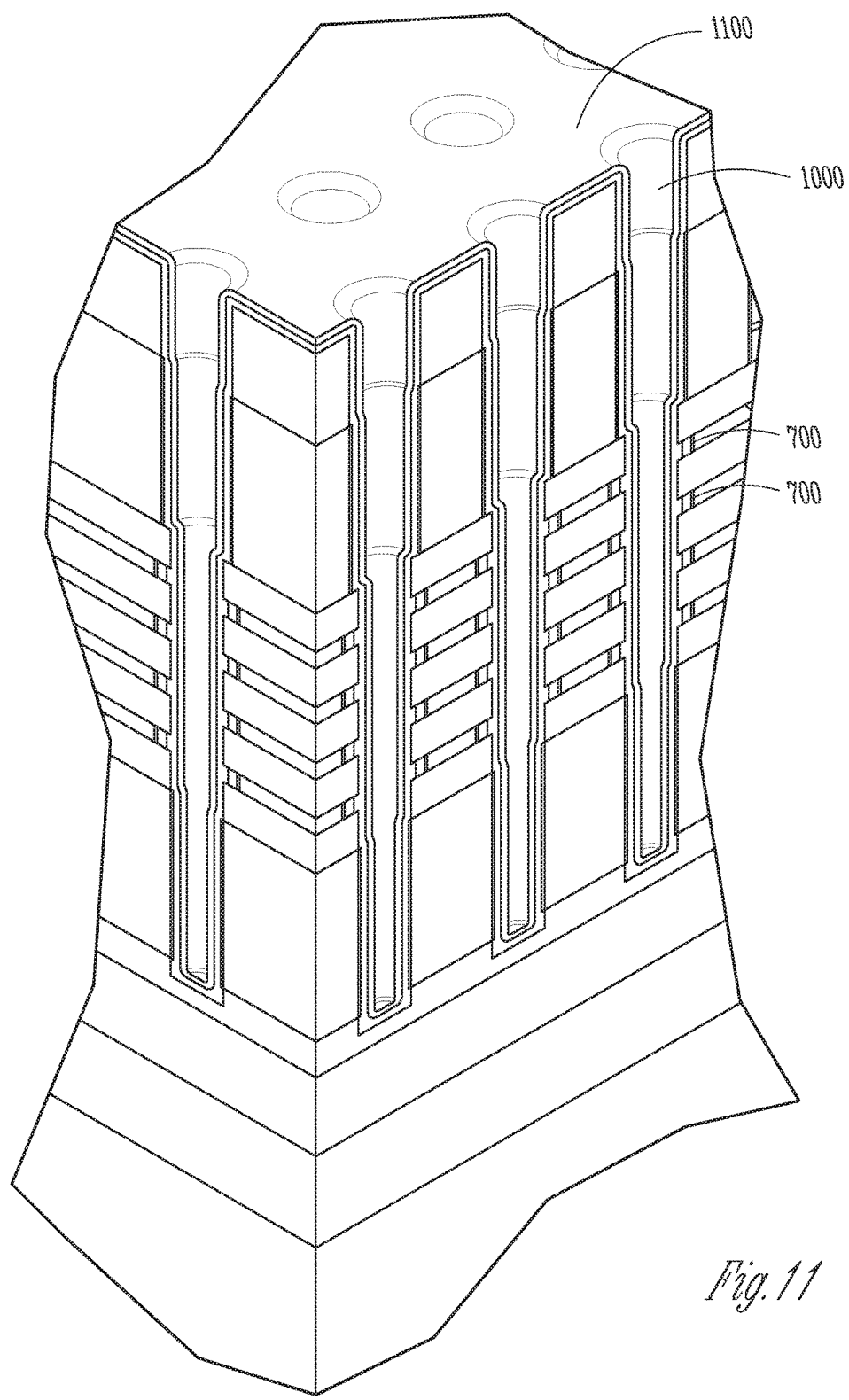
Figure 12:
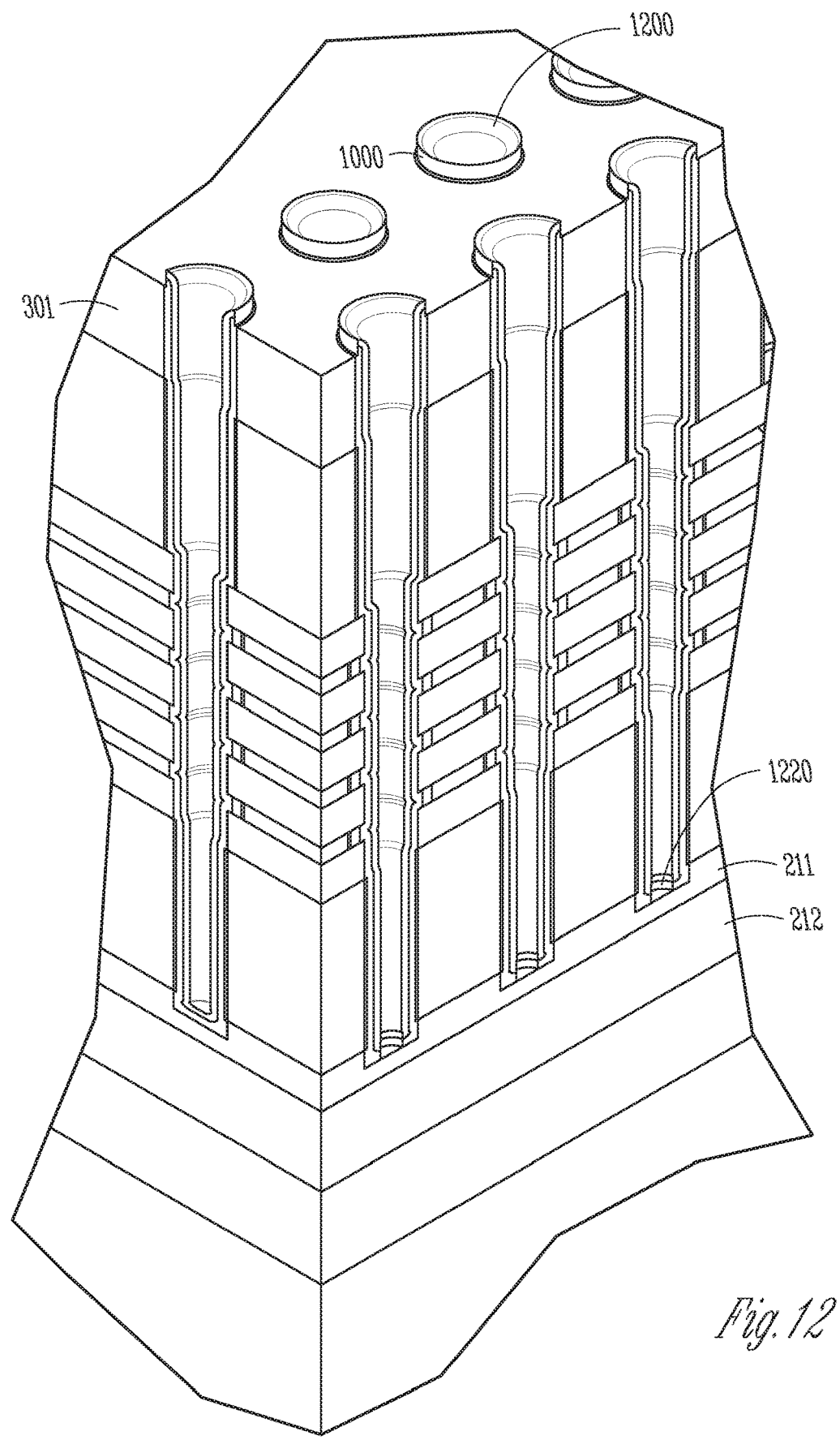

FIG. 11 depicts the structure of FIG. 10 after forming of a sacrificial polysilicon liner material 1100. Sacrificial polysilicon liner material 1100 is formed (e.g., deposited) over the tunnel dielectric material 1000 formed (e.g., grown) in the embodiment of FIG. 10 The liner material 1100 is formed (e.g., deposited) over the opening sidewalls and floating gates of the cells FIG. 12 depicts the structure of FIG. 11 after a punch operation (e.g., very directional dry etch) is performed to remove the stack top portion of the polysilicon liner material 1100 of FIG. 11 as well as polysilicon liner material 1100 at the bottom 1220 of each opening but not remove the material on the sidewall of the pillar opening (e.g., the tunnel oxide is protected from this punch). The punch operation exposes an upper portion 1200 of the polysilicon liner material 1100 from the openings that has been surrounded and protected by the oxide 1000. The punch also exposes the oxide layer 211 between the bottom 1220 of the openings and the common source node material 212. The punch operation may be a directional (non-isotropic) etch process.

Figure 13:
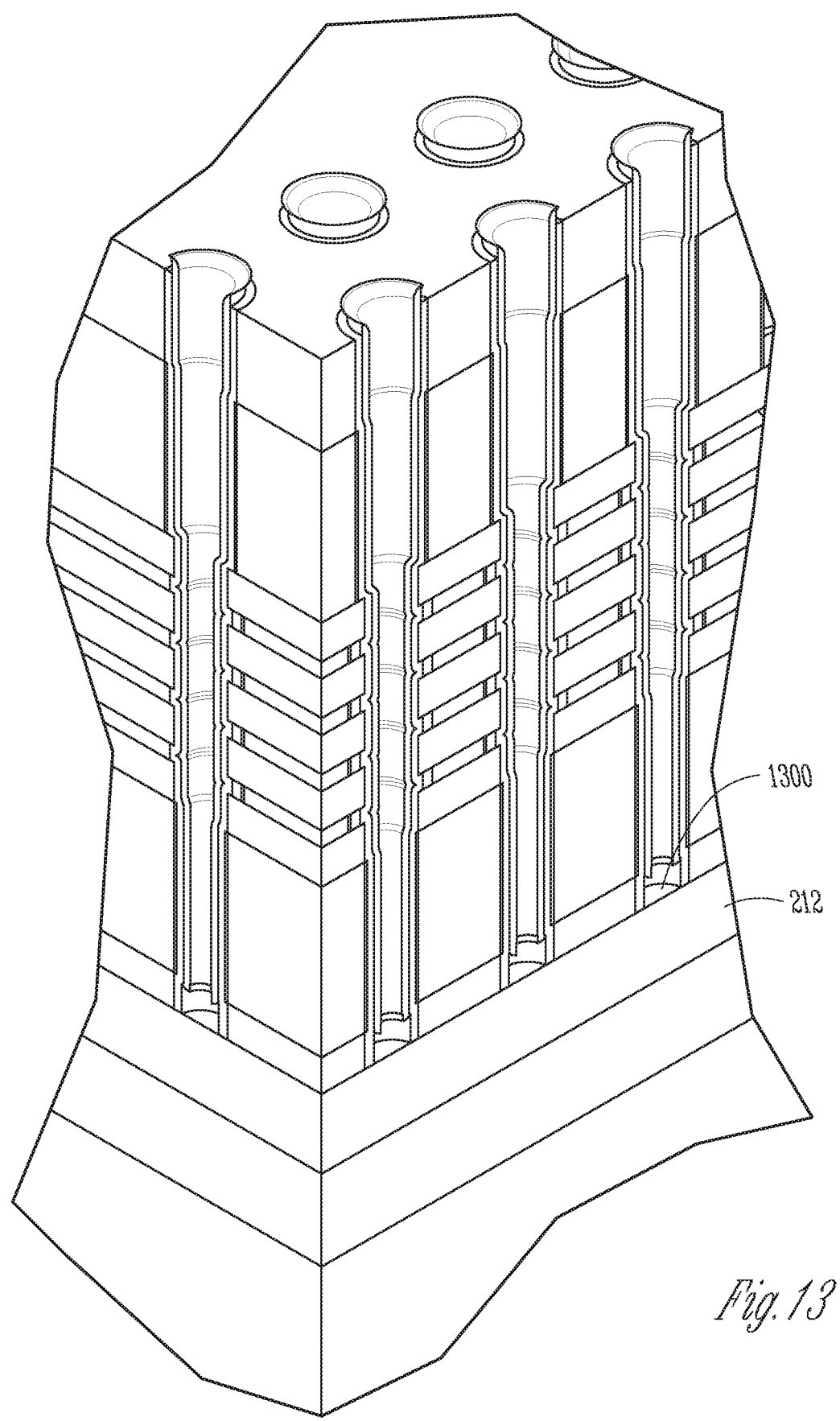

FIG. 13 depicts the structure of FIG. 12 after the protective oxide 1000 is removed (e.g., wet oxide etch) to expose the source node material 212 at the bottom 1300 of each opening. Thus, after the subsequent poly liner removal (PLR) process, the contacting area to the source is enlarged.

Figure 14:
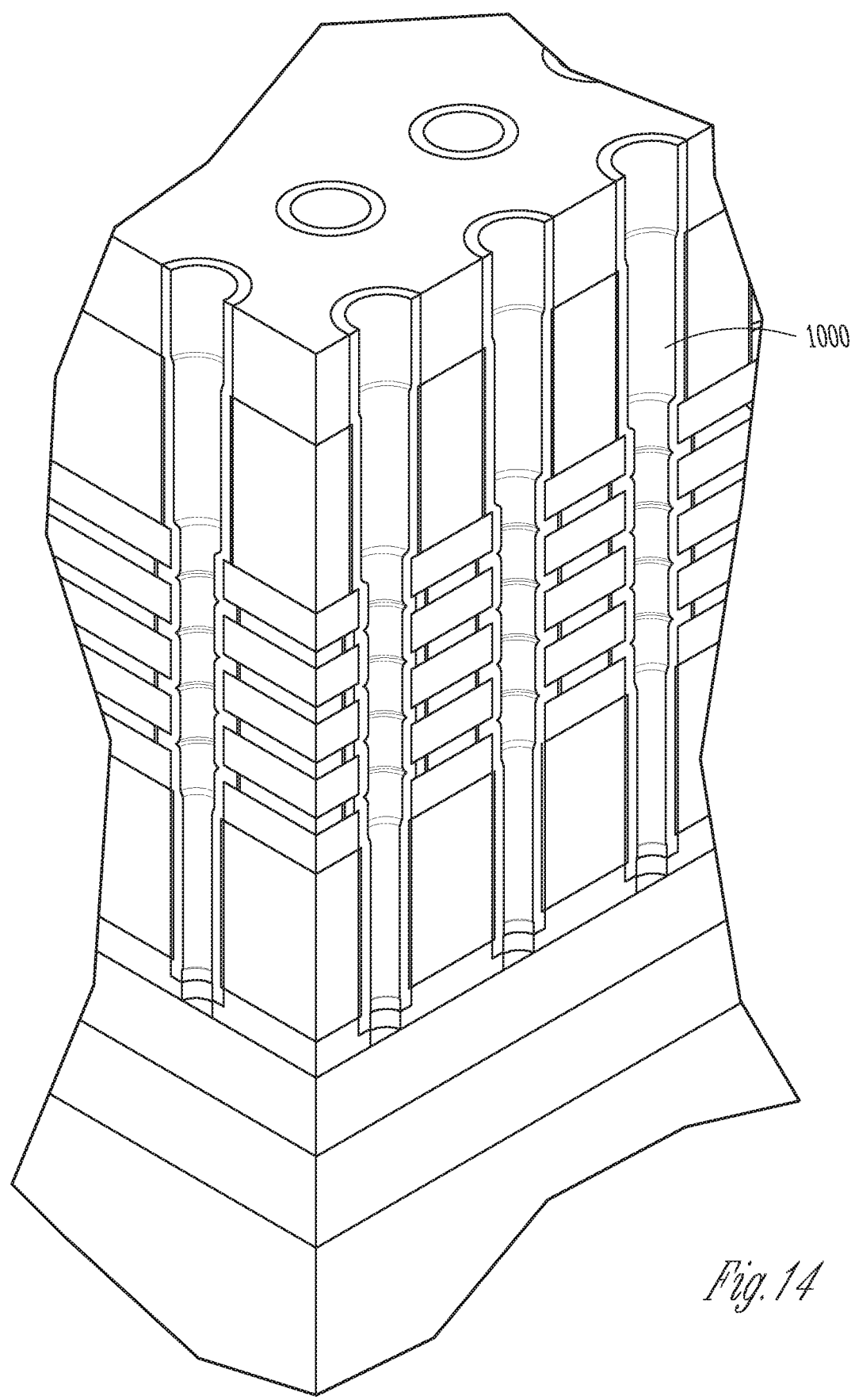

FIG. 14 depicts the structure of FIG. 13 after the polysilicon liner material 1100 is removed by a PLR process (e.g., an isotropic etch very selective to oxide) to expose the tunnel dielectric material 1000 while keeping the tunnel dielectric material 1000 intact.

Figure 15:
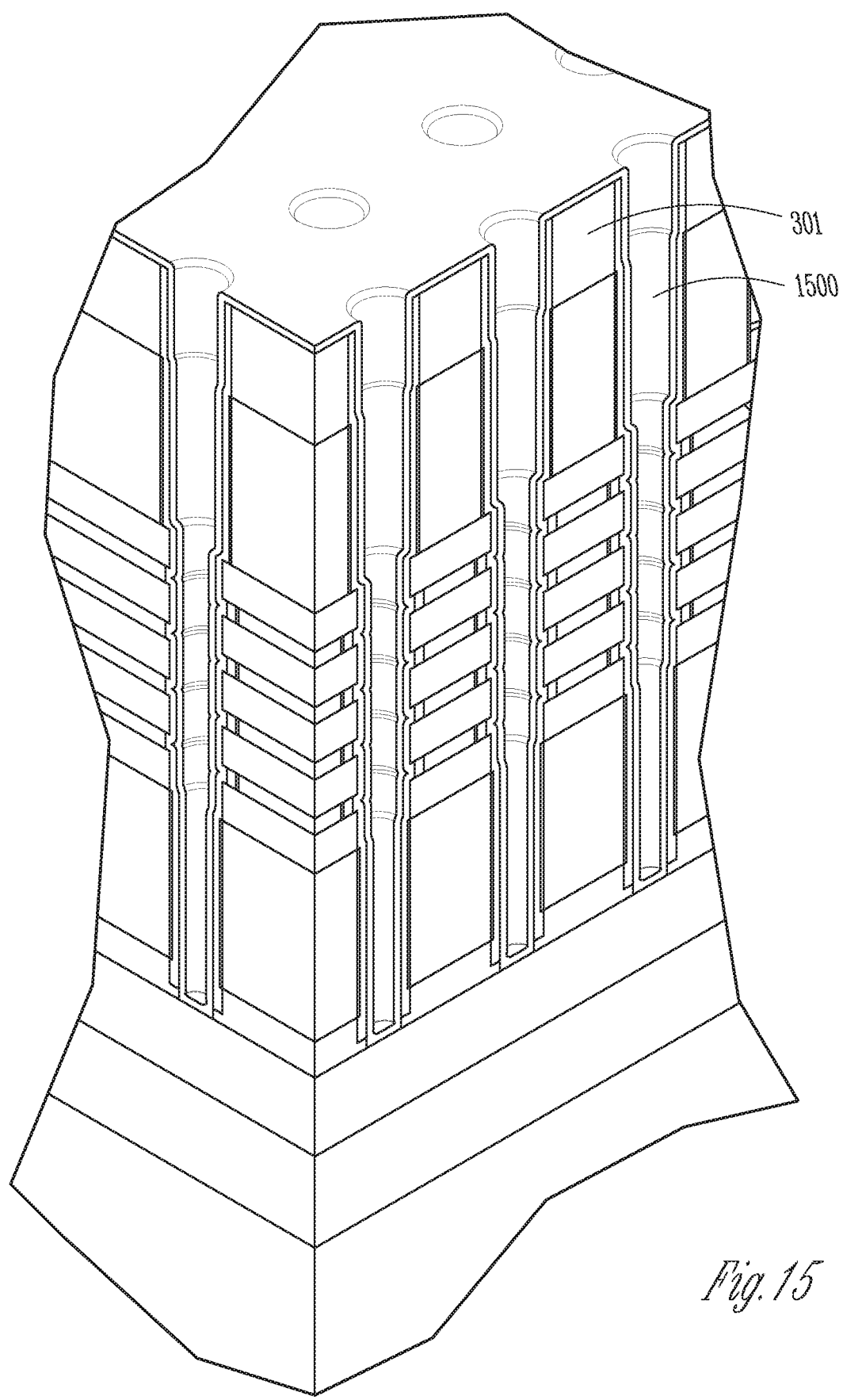

FIG. 15 depicts the structure of FIG. 13 after the formation of a pillar material 1500 in the openings. A pillar material (e.g., polysilicon) 1500 is formed (e.g., deposited) on the then sidewalls of the openings as well as over the oxide cap 301. The pillar material may be formed to a thickness (e.g., approximately 10 nm) and is generally conformal along the sidewalls and bottom of the pillar openings (e.g., contacting the common source node) to act as a channel for the memory cells. An optional inner sidewall treatment (e.g., thermal oxidation) may be performed in order to improve channel conduction properties. This thickness for the pillar material will, in many examples, leave a central void in the pillar, which will be filled.

Figure 16:
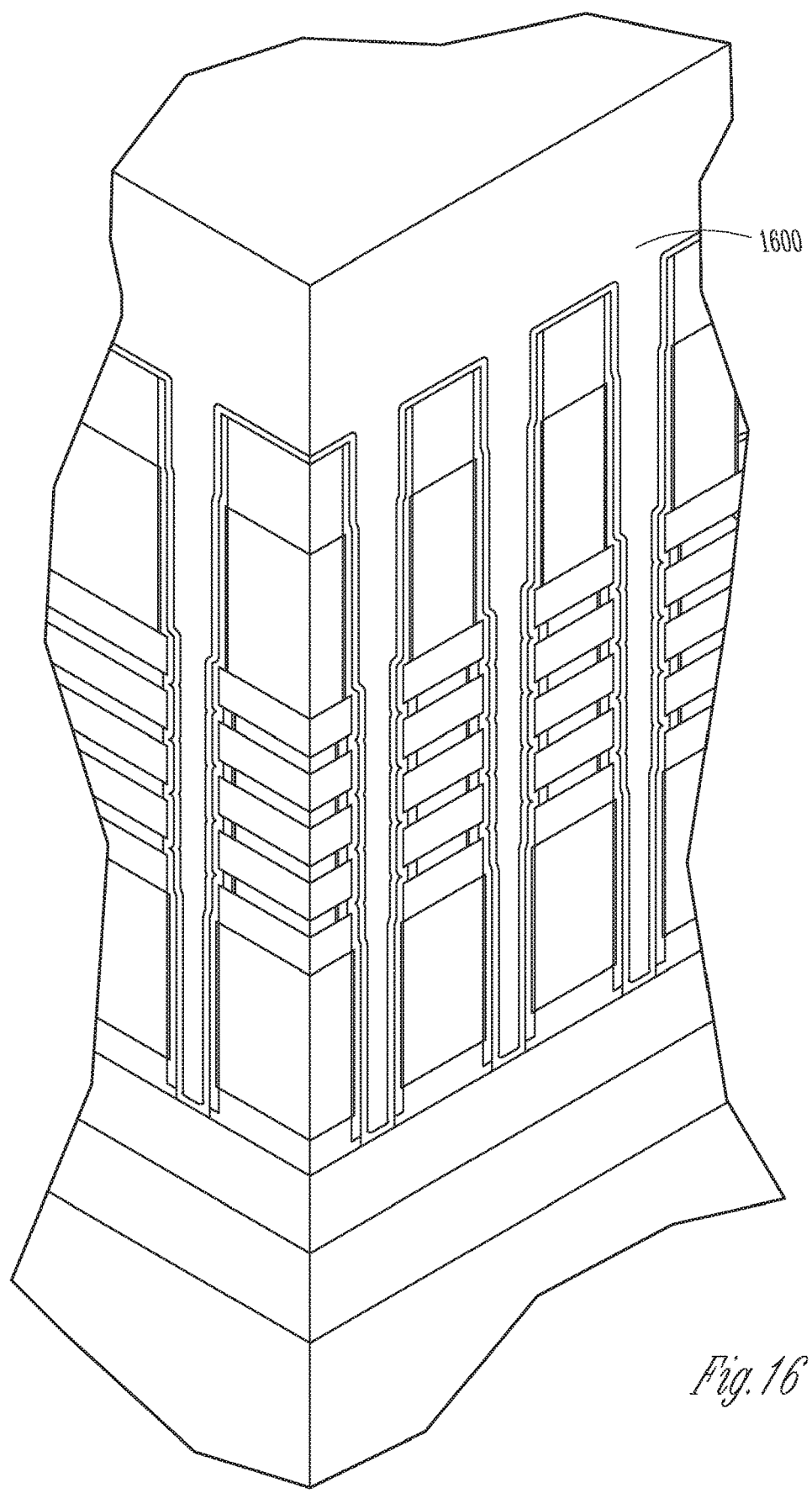

FIG. 16 depicts the structure of FIG. 15 after the filling of the voids in the pillar material 1500. In this example process flow, dielectric material (e.g., oxide) 1600 is formed in the openings of the pillar material 1500. A spin-on process may be used to form the oxide 1600 and fill the voids. Pre and/or post thermal treatment of this spin-on dielectric may be performed for device performance improvement.

Figure 17:
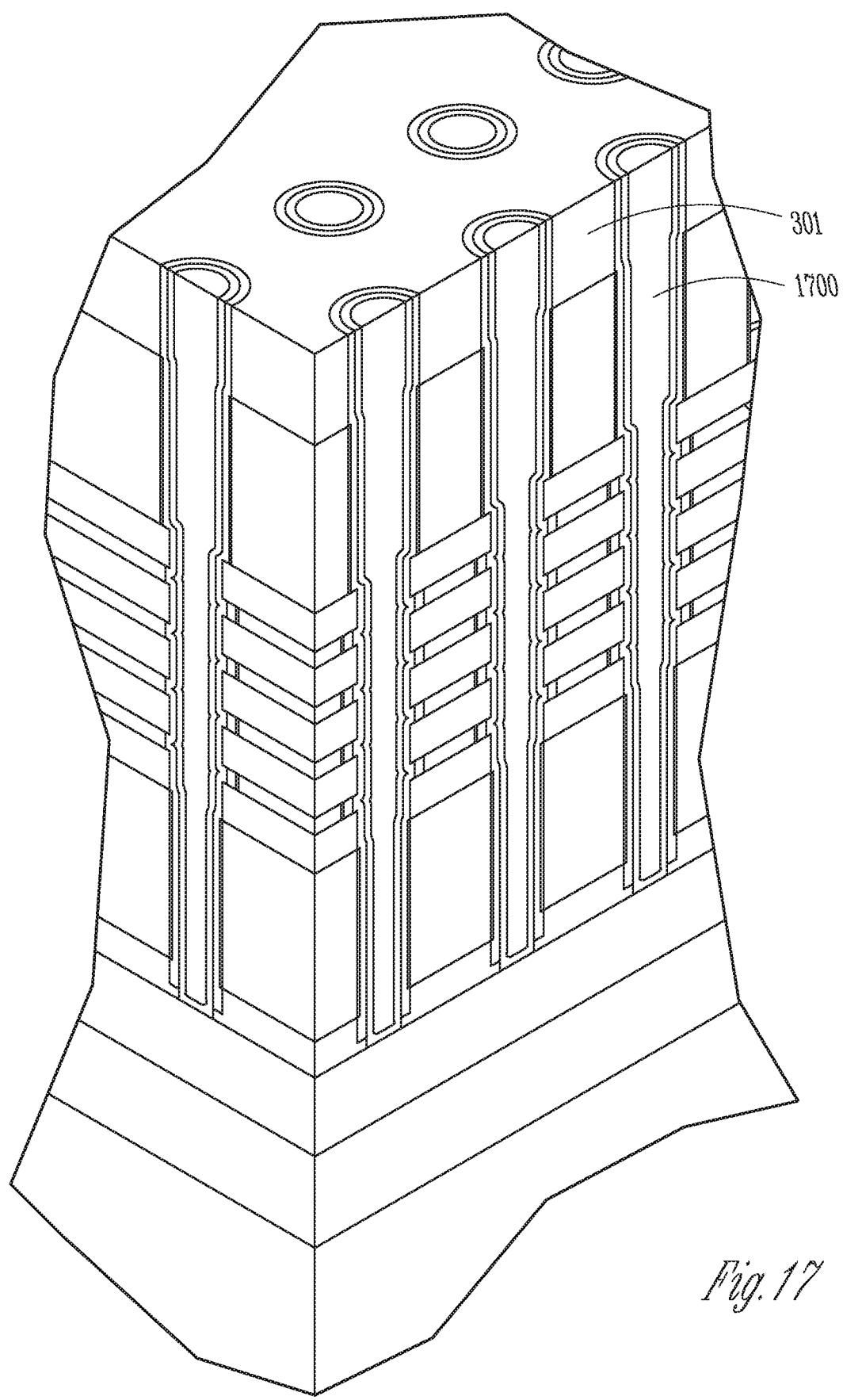

FIG. 17 depicts the structure of FIG. 16 after removal of the pillar material 1500 and dielectric material 1600 on top of the stack. This may be accomplished by a spin oxide chemical mechanical polishing (CMP) operation that stops on the pillar material 1500 and a pillar poly CMP that stops on the cap oxide 301. Thus, the tops 1700 of the filled pillar openings are exposed and isolated from one another.

Figure 18:
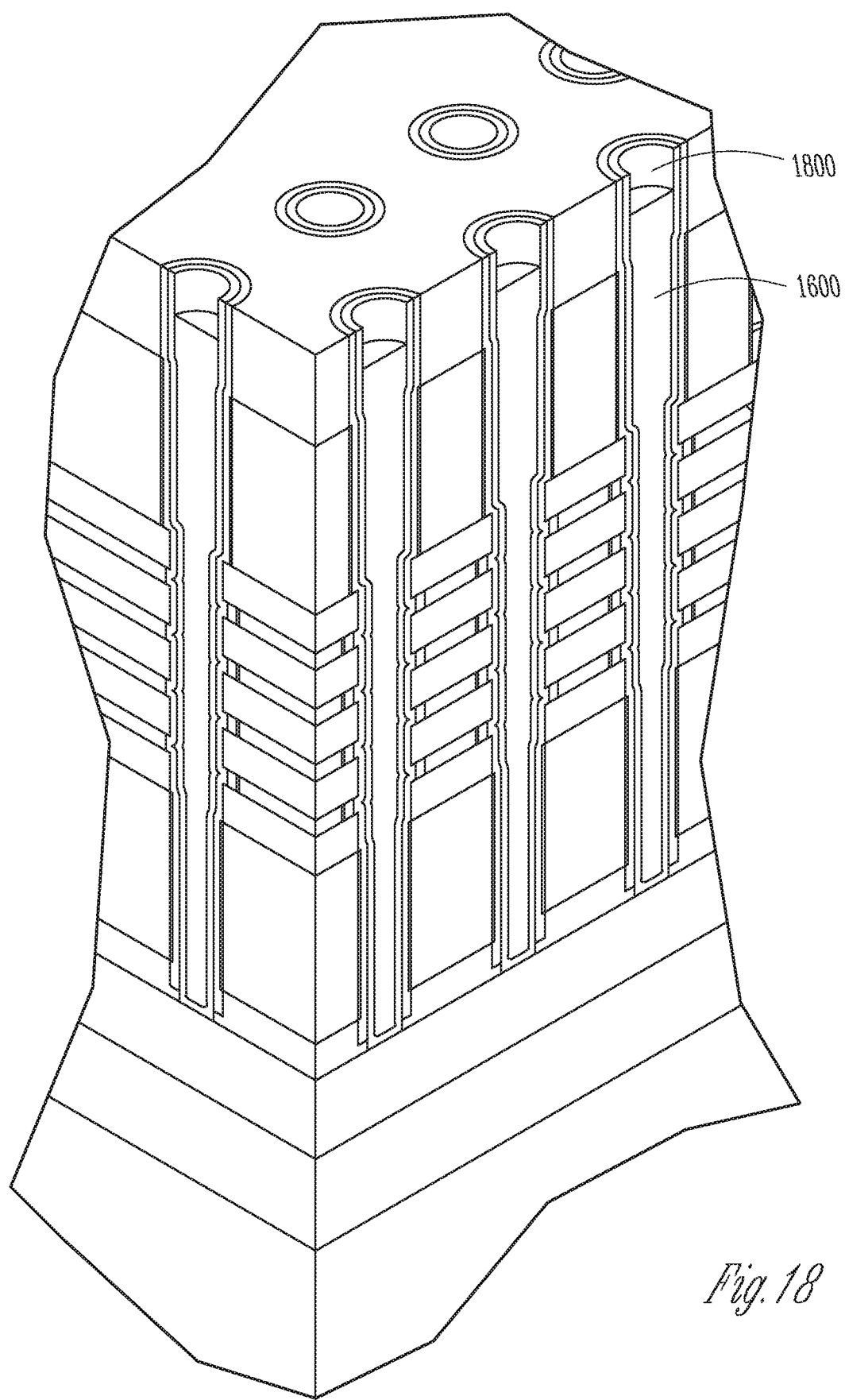

FIG. 18 depicts the structure of FIG. 17 after the forming of a recess 1800 in the tops of the pillar oxide 1600. This may be accomplished by controlled oxide wet etch process.

Figure 19:
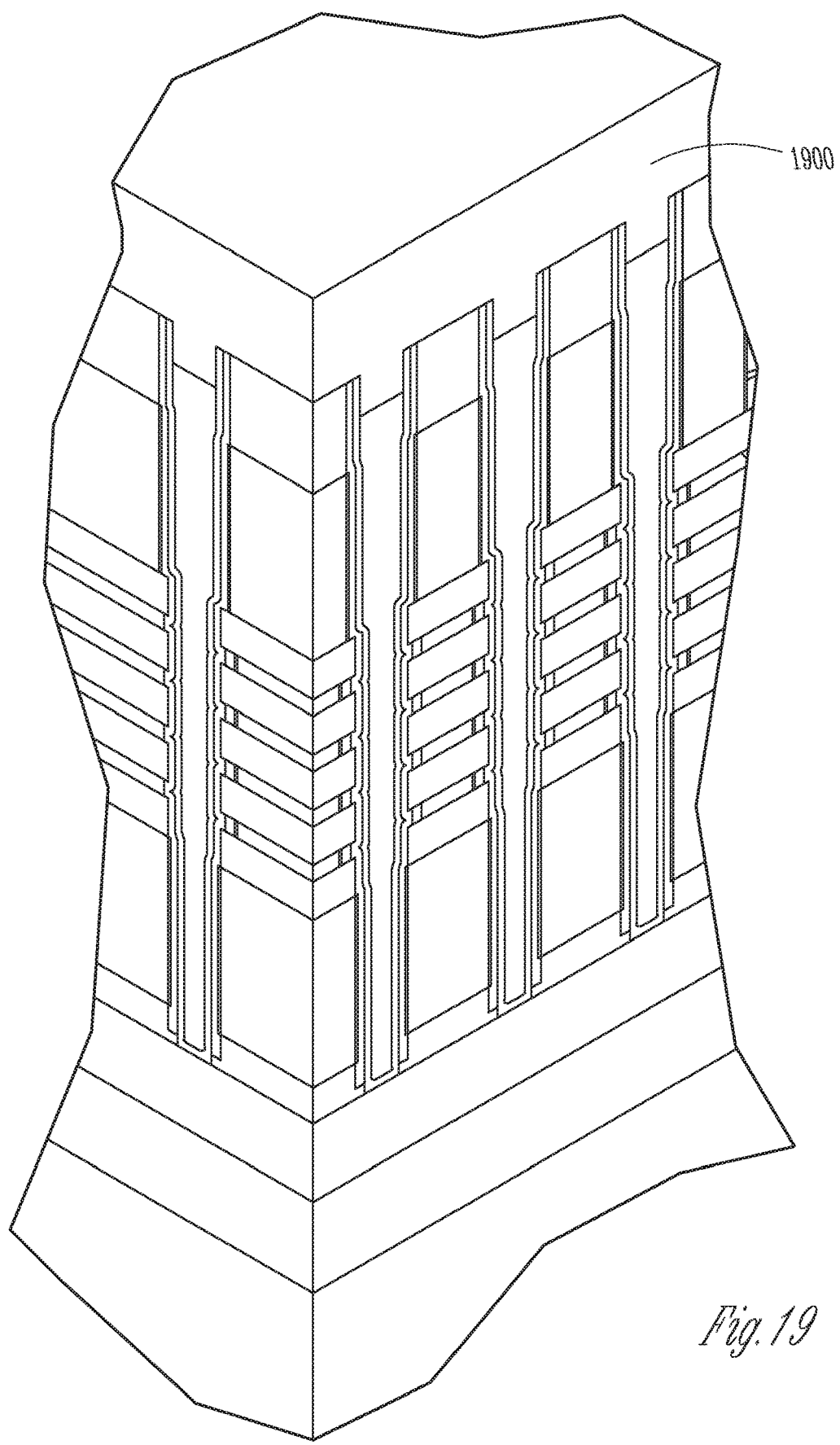

FIG. 19 depicts the structure of FIG. 18 after the forming of a plug material in the recesses 1800. A plug material 1900 is formed (e.g., deposited) over the top of the stack and into the recesses 1800 above the pillars. In an embodiment, the plug material 1900 is a doped polysilicon.

Figure 20:
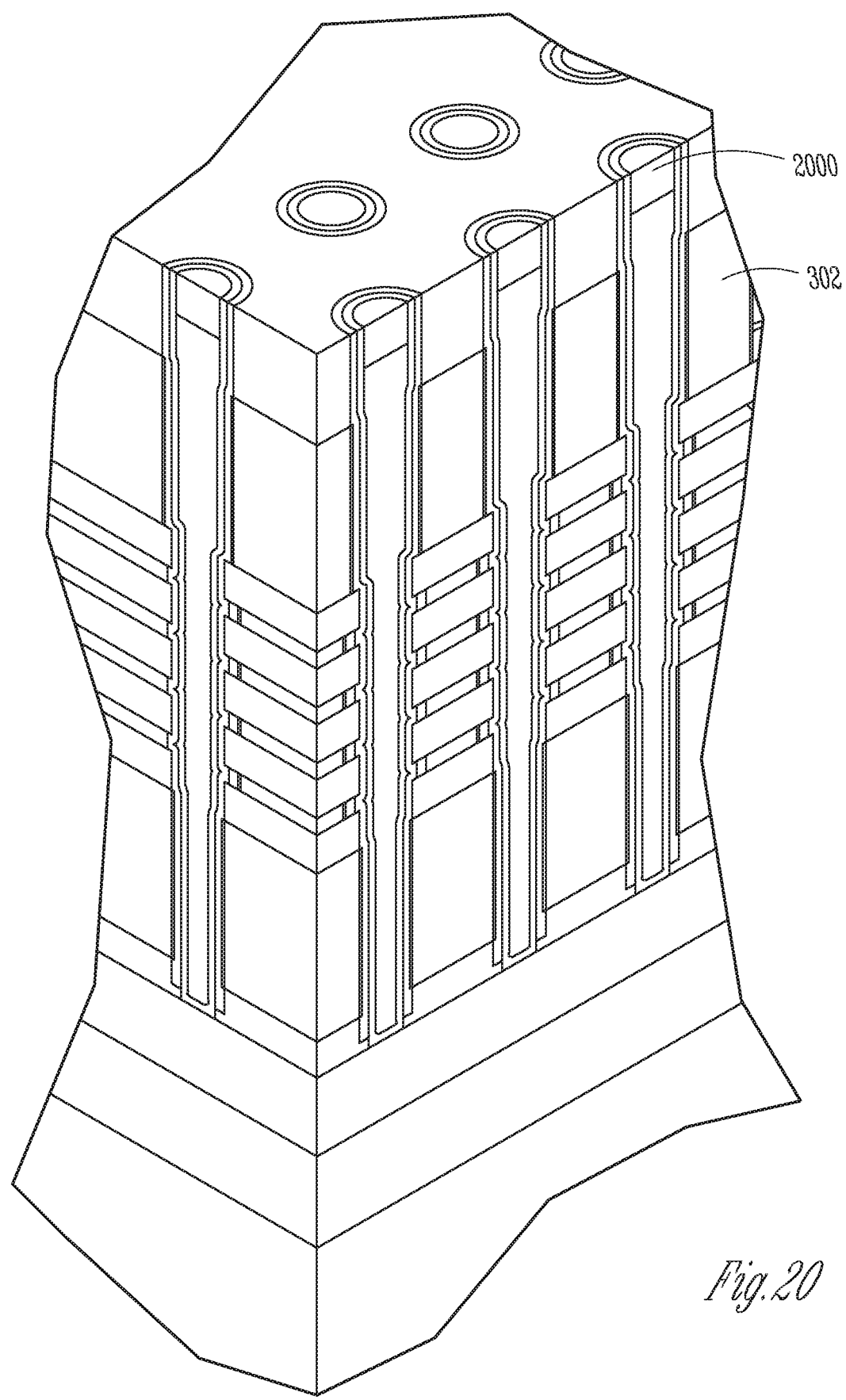

FIG. 20 depicts the structure of FIG. 19 after the plug material 1900 on top of the stack is removed to leave only the plug 2000 (e.g., polysilicon) isolated (from other pillars) over each pillar. The removal of the plug material 1900 may be accomplished by a polysilicon CMP. The plug 2000 acts as the drain to tie to the channel, which may be turned on or off by the SGD/SGS and other control gates and is eventually coupled to data lines (e.g., bit lines) of the memory.

Figure 21:
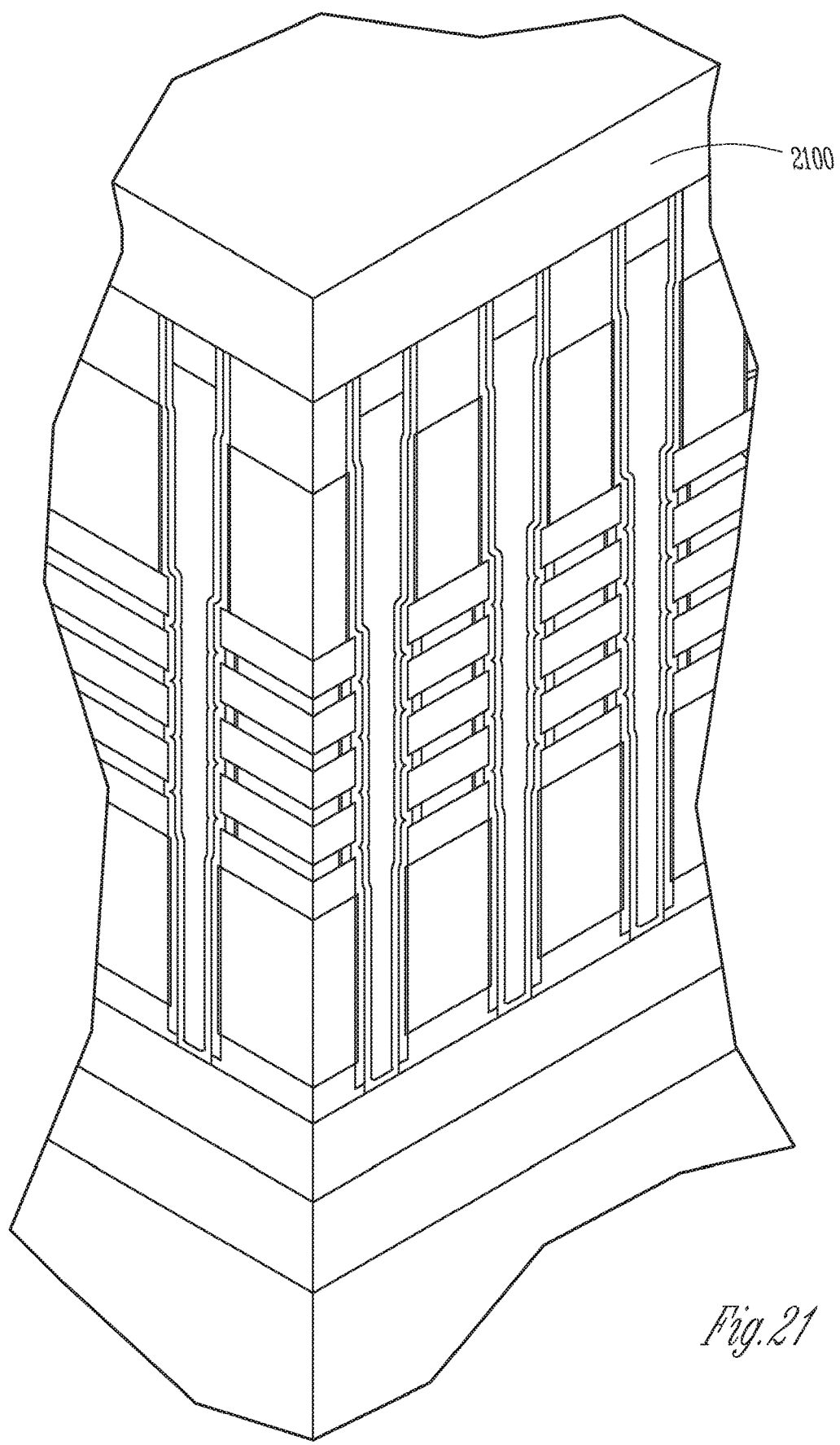

FIG. 21 depicts the structure of FIG. 20 after a protective material 2100 (e.g., oxide) is formed (e.g., deposited) over the top of the stack as a protective oxide. The protective material 2100 provides protection of the fabricated charge storage structure from further processing as a replacement control gate is fabricated.

Figure 22:
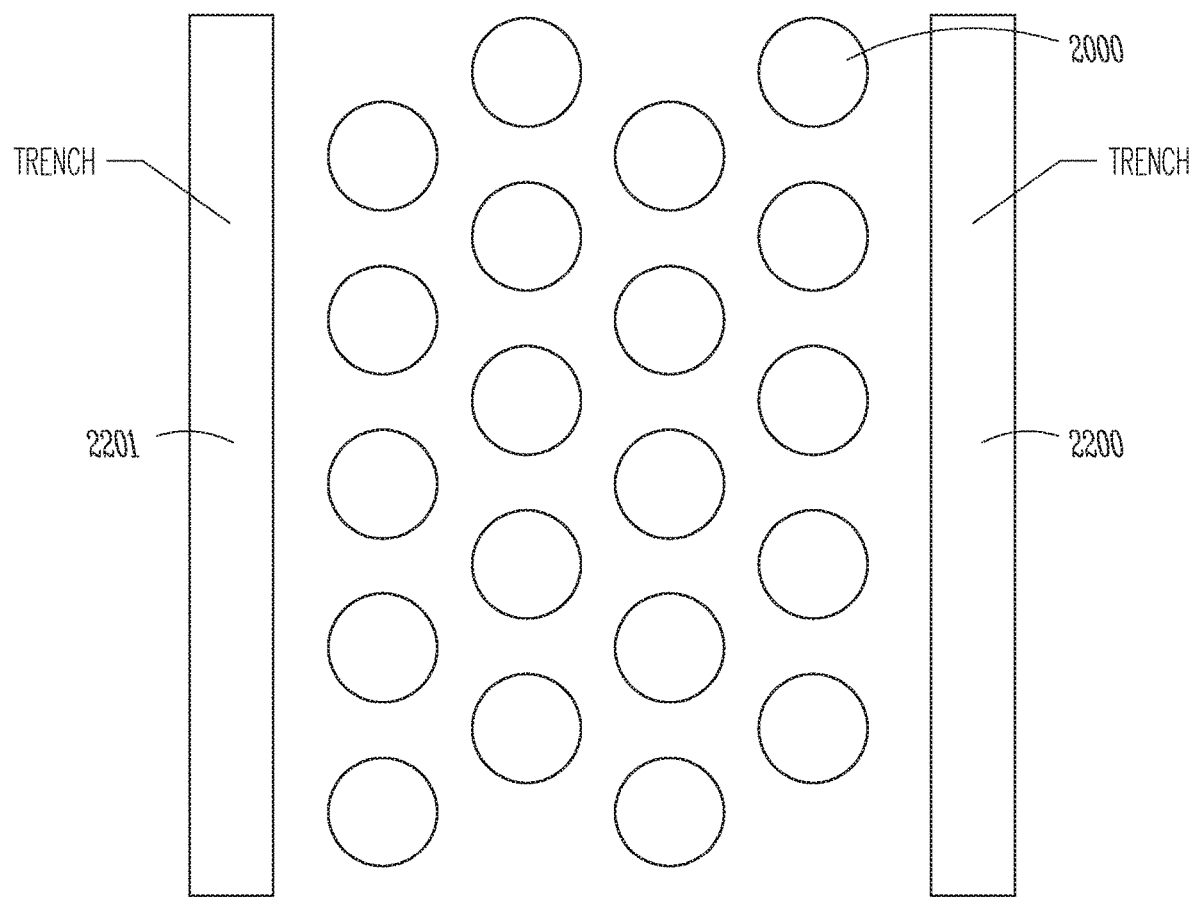

FIG. 22 schematically depicts a portion of the structure after the operation discussed relative to FIG. 20 (and without the protective layer of FIG. 21), depicted here from a top view after the formation of trenches 2200 and 2201. Thus, FIG. 22 shows the plugs 2000 of each pillar under the protective material 2100 as well as trenches 2200, 2201. As described subsequently with reference to FIGS. 23 and 24, the trenches 2200, 2201 may be used to separate memory blocks. The trenches 2200, 2201 cut through and separate access lines (e.g., word lines), SGD transistor control lines, and (optional) SGS transistor control lines in order to provide self-contained address units for each memory block. The trenches 2200, 2201 are used in the example process flow to form word lines from outside the pillars as disclosed subsequently. The SGS transistor control lines are not described herein as these lines were predefined as the gaps in layer 210 of FIG. 2 prior to forming the stack.

In an embodiment, the pillars may be located about 150 nm from pillar-center to pillar-center and the trenches 2200, 2201 spaced apart by about 600 nm or more. These distances are for purposes of illustration only as other embodiments may use different distances.

The following described fabrication flow diagrams of FIGS. 23-34 provide details for fabrication of a replacement control gate for the above-described charge storage structure. As noted earlier herein, a "replacement control gate" as used herein refers to a control gate that is fabricated after the charge storage structure has been fabricated, as described previously with reference to FIGS. 2-21.

Figure 23:
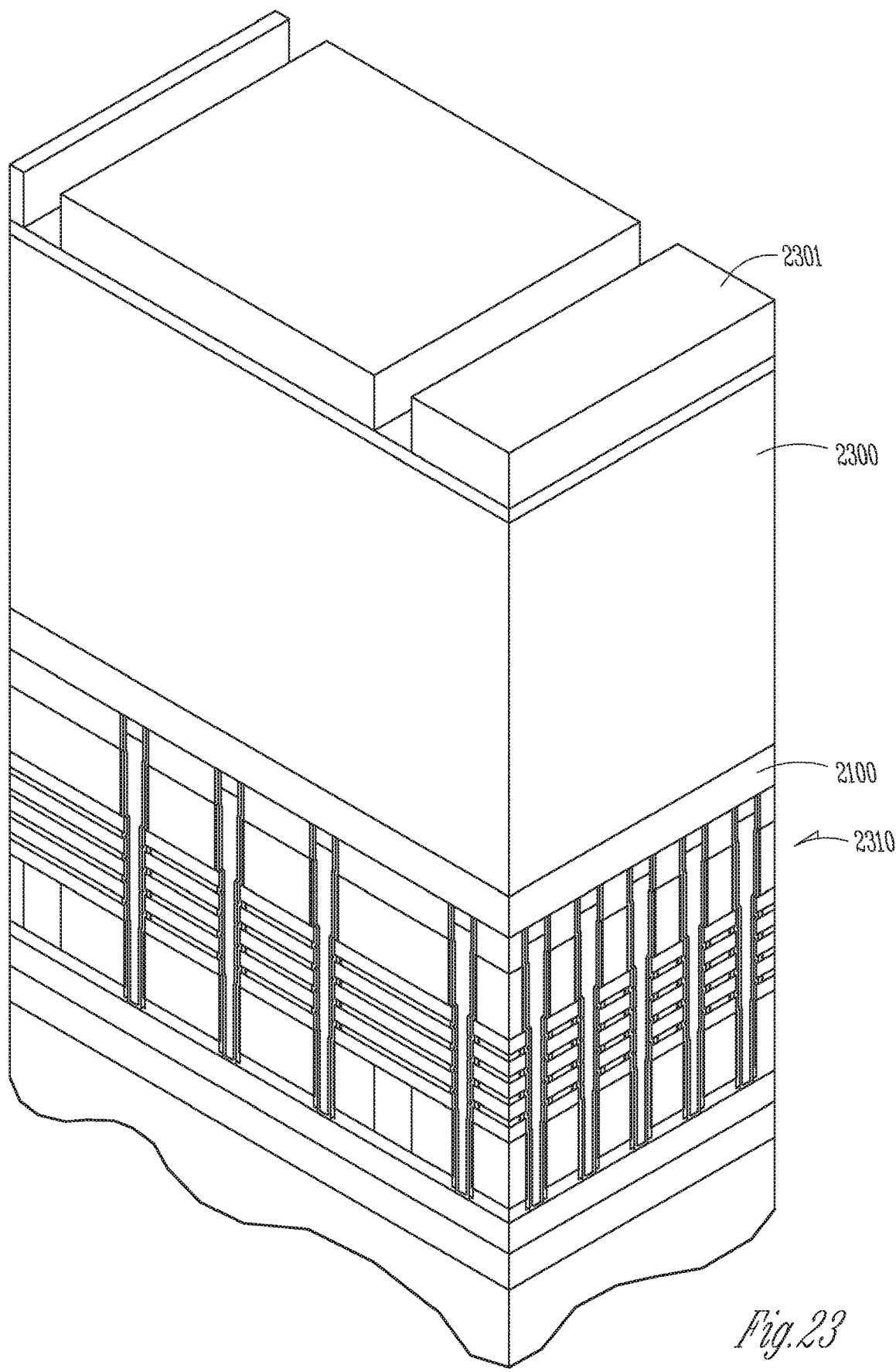

FIG. 23 depicts the structure of FIG. 21 after forming of a hard mask material layer. Hard mask material 2300 is formed (e.g., deposited) over the protective material 2100 of the charge storage stack structure 2310. The hard mask material 2300 may be, for example, a nitride hard mask or some other etch resistant material. A photolithography process may be used to produce a trench pattern 2301 over the hard mask material 2300.

Figure 24:
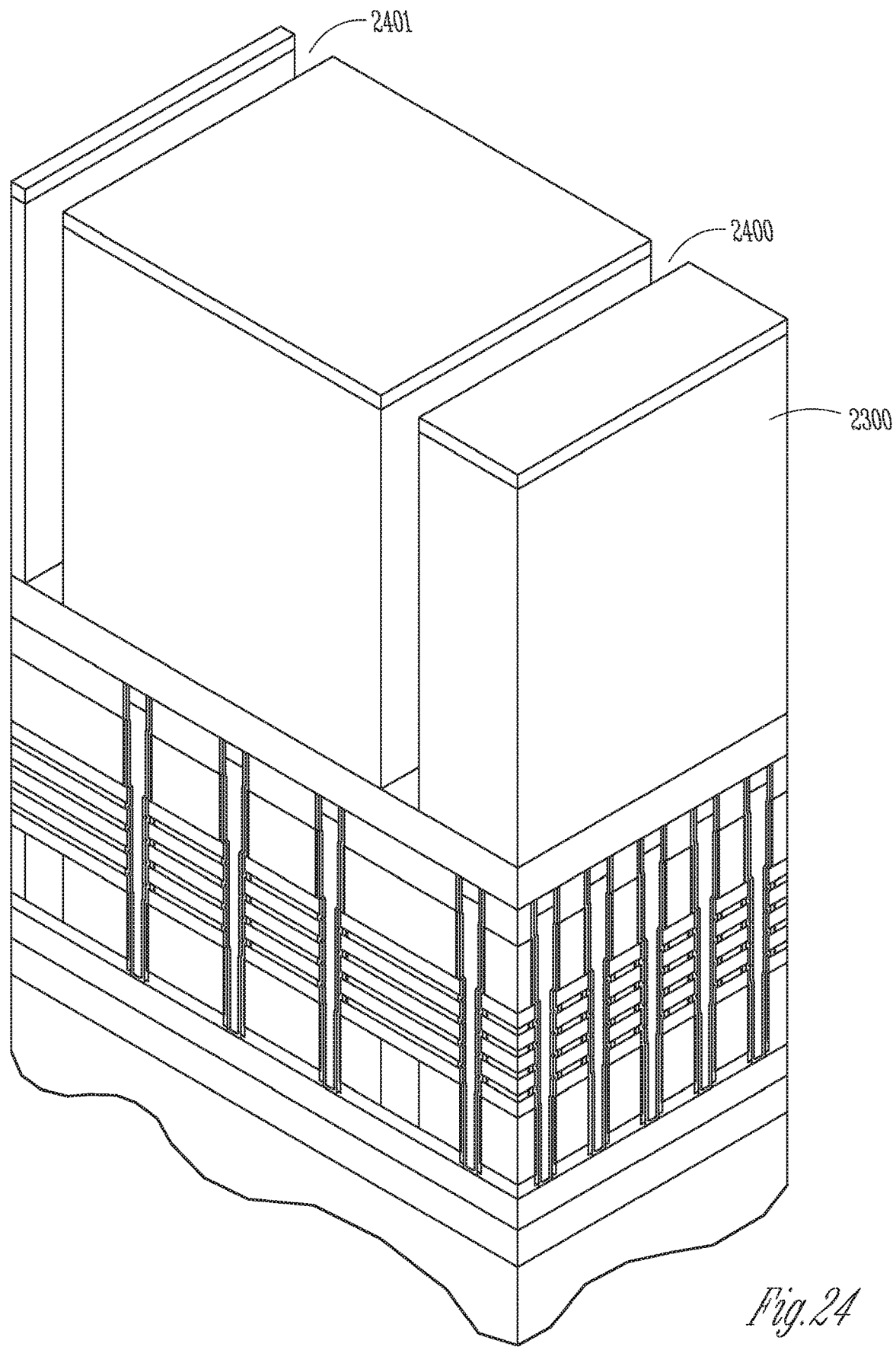

FIG. 24 depicts the structure of FIG. 23 after the hard mask material 2300 is patterned by an etch process to form trenches 2400, 2401 in the hard mask material 2300.

Figure 25:
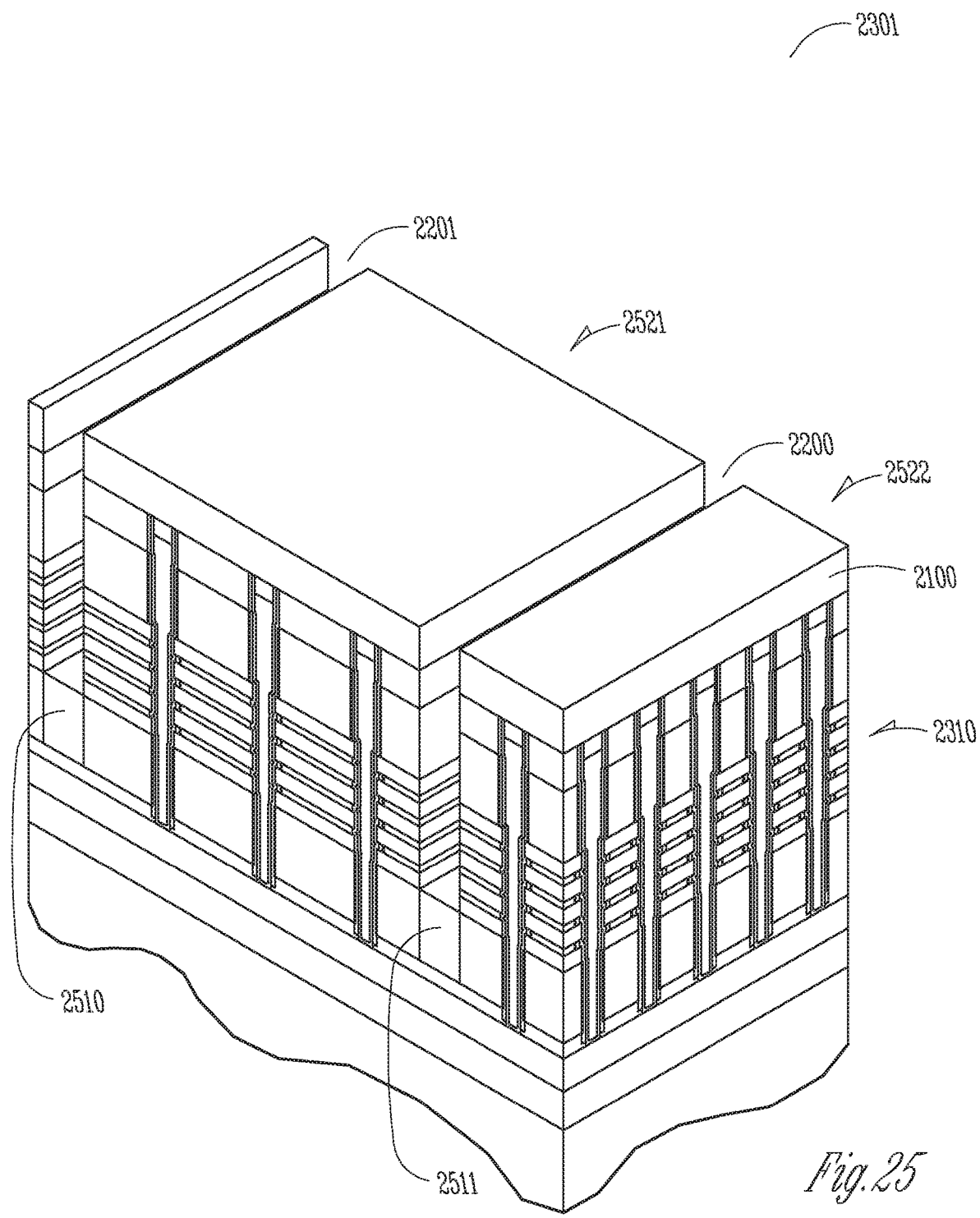

FIG. 25 depicts the structure of FIG. 24 after forming of trenches 2200 and 2201. Using the patterned hard mask material 2300, a deep trench etch process may be used to form the trenches 2200, 2201 through the charge storage structure 2310 down to an etch stop material 2510, 2511 (e.g., oxide). The etch stop material 2510, 2511 may have been formed over the substrate during formation of the interleaved tiers, or alternatively the etch stop material 2510, 2511 may be formed during the present flow process of forming the trenches 2200, 2201. As identified previously, the trenches 2200, 2201 separate groups of vertical strings of memory cells (e.g., memory blocks). The hard mask material 2300 is removed during this process leaving the protective material 2100 on top of the charge storage structure 2310. As a result of this process, it can be seen that the exposed surfaces of the interleaved dielectric material tiers and nitride material tiers form a portion of the sidewalls defining the trenches.

The trenches 2200, 2201 are shown dividing the charge storage structure 2310 up into separate memory blocks 2521, 2522. Thus, each of the subsequently fabricated replacement control gates may be associated with a different respective memory block 2521, 2522.

Figure 26:
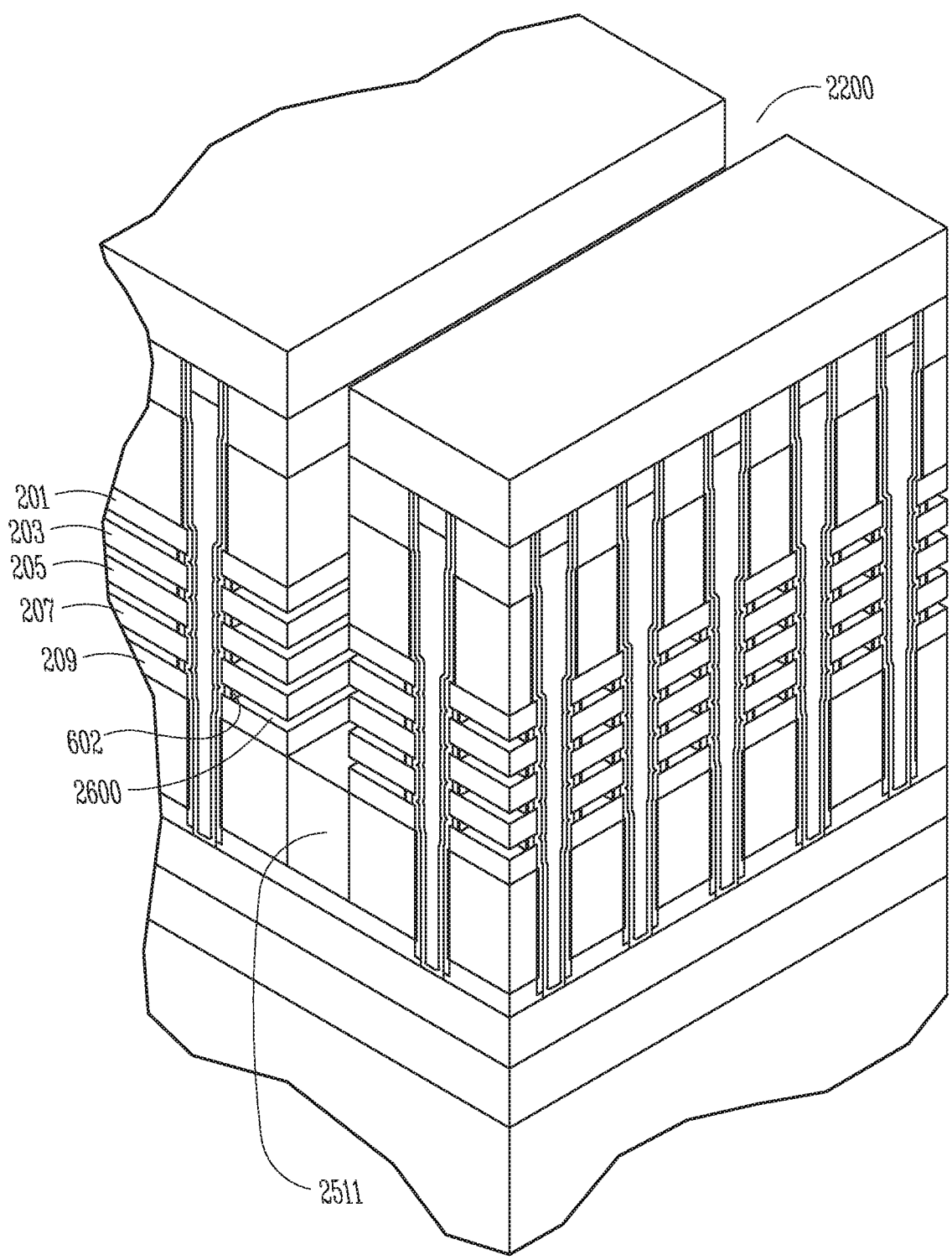

FIG. 26 depicts the structure of FIG. 25 after etching of the nitride material tiers 202, 204, 206, 208. The nitride material tiers 202, 204, 206, 208 (as seen in FIG. 2) are removed up to the dielectric liner 602 (e.g., oxide). For example, an isotropic etch process may be used to selectively remove the nitride material tiers 202, 204, 206, 208 without removing the oxide liners 602 or dielectric material tiers 201, 203, 205, 207, 209. This forms control gate recesses in the tiers, adjacent to the floating gates, in what used to be nitride material tiers.

Figure 27:
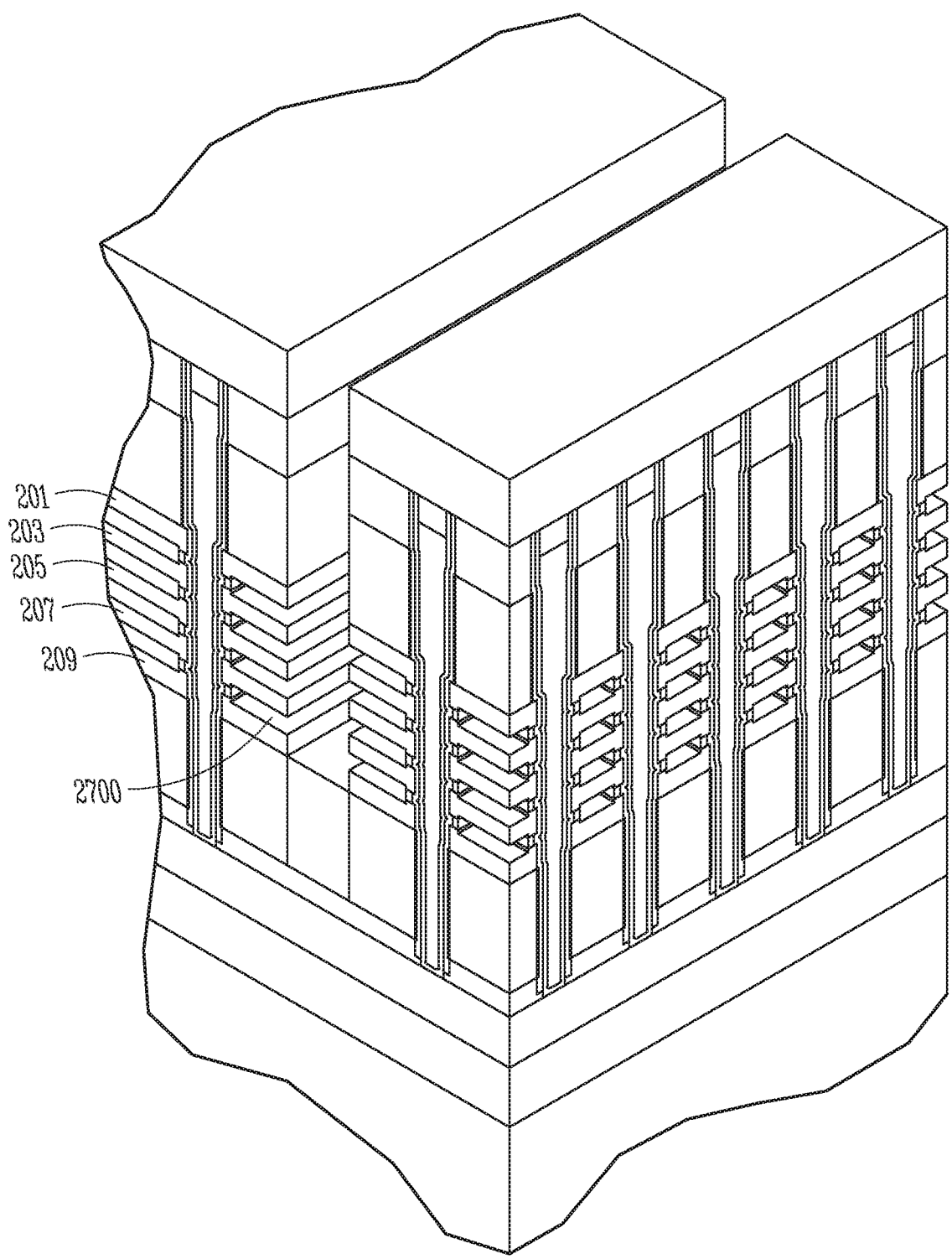

FIG. 27 depicts the structure of FIG. 26 after etching of dielectric material tiers 201, 203, 205, 207, 209. The control gate recesses 2700 resulting from the nitride tier removal are enlarged by reducing the thickness of the dielectric material tiers 201, 203, 205, 207, 209. The thickness reduction may be accomplished by a controlled isotropic oxide etch process, such as self-timing vapor oxide etch. These control gate recesses will house the control gates as well as the associated dielectric structures that will lie between each control gate and an adjacent floating gate. In many examples processes, the dielectric structure will extend around the top and bottom of the control gate. As a result of the increased vertical dimension of the control gate recesses achieved by reducing the thickness of the vertically adjacent dielectric material tiers, the control gates and associated dielectric structures can have a vertical dimension that is greater than the vertical dimension of the adjacent floating gate. As the control gates and associated dielectric structures will fill the vertical extent of the associated control gate recesses, the vertical dimension of the control gates and associated dielectric structures in each control gate recess will be greater than the vertical dimension of the nitride material layers in which they are located.

Figure 28:
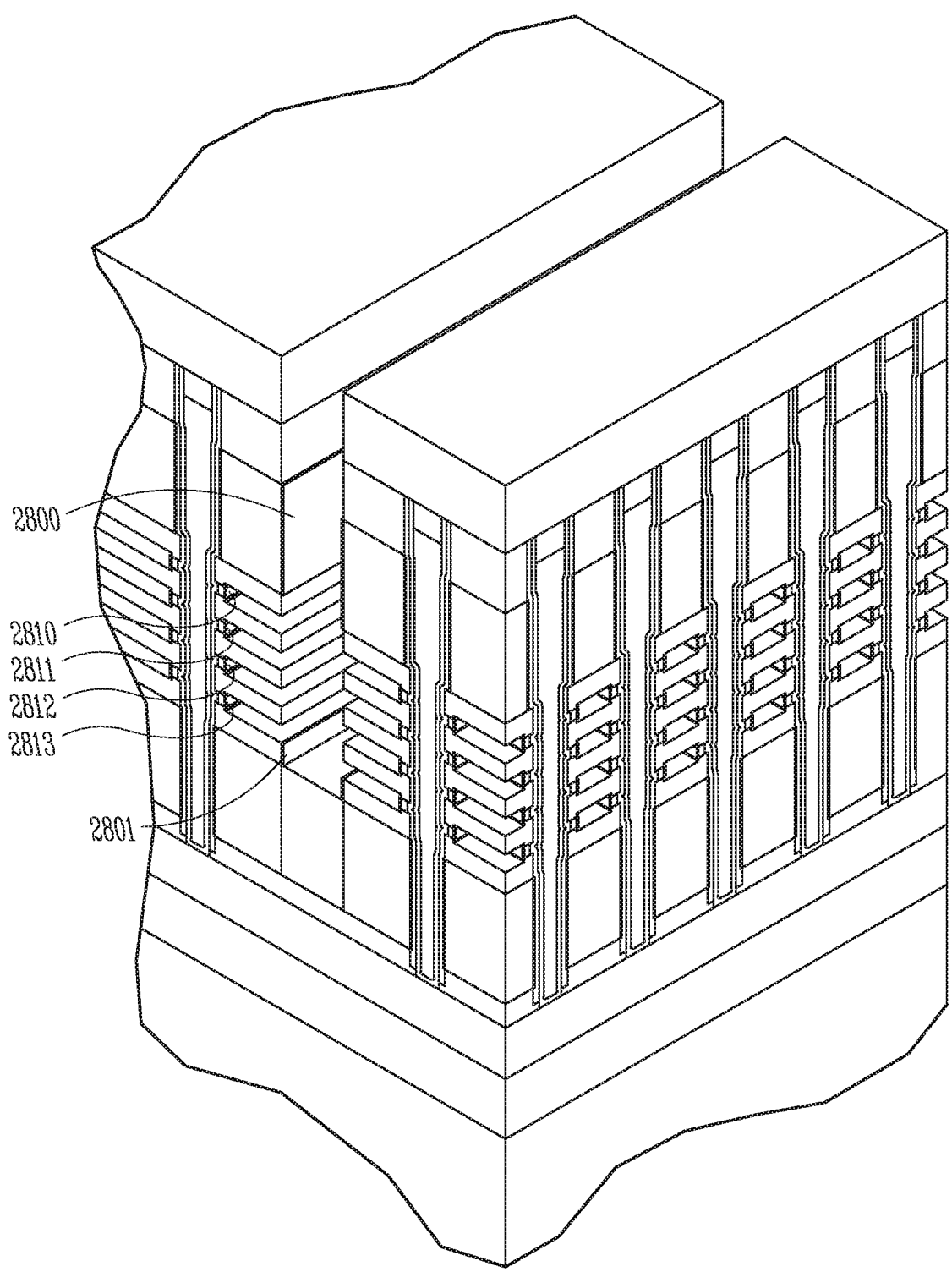

FIG. 28 depicts the structure of FIG. 27 after a dielectric material 2810-2813 (e.g., oxide) is formed (e.g., deposited, grown) on the backside of the floating gate material in the control gate recesses. A dielectric material 2800, 2801 (e.g., oxide) is also formed (e.g., deposited, grown) on the SGS and SGD materials. In an embodiment, an oxidation process of the polysilicon may be performed to grow the oxide 2800, 2801, 2810-2813.

Figure 29:
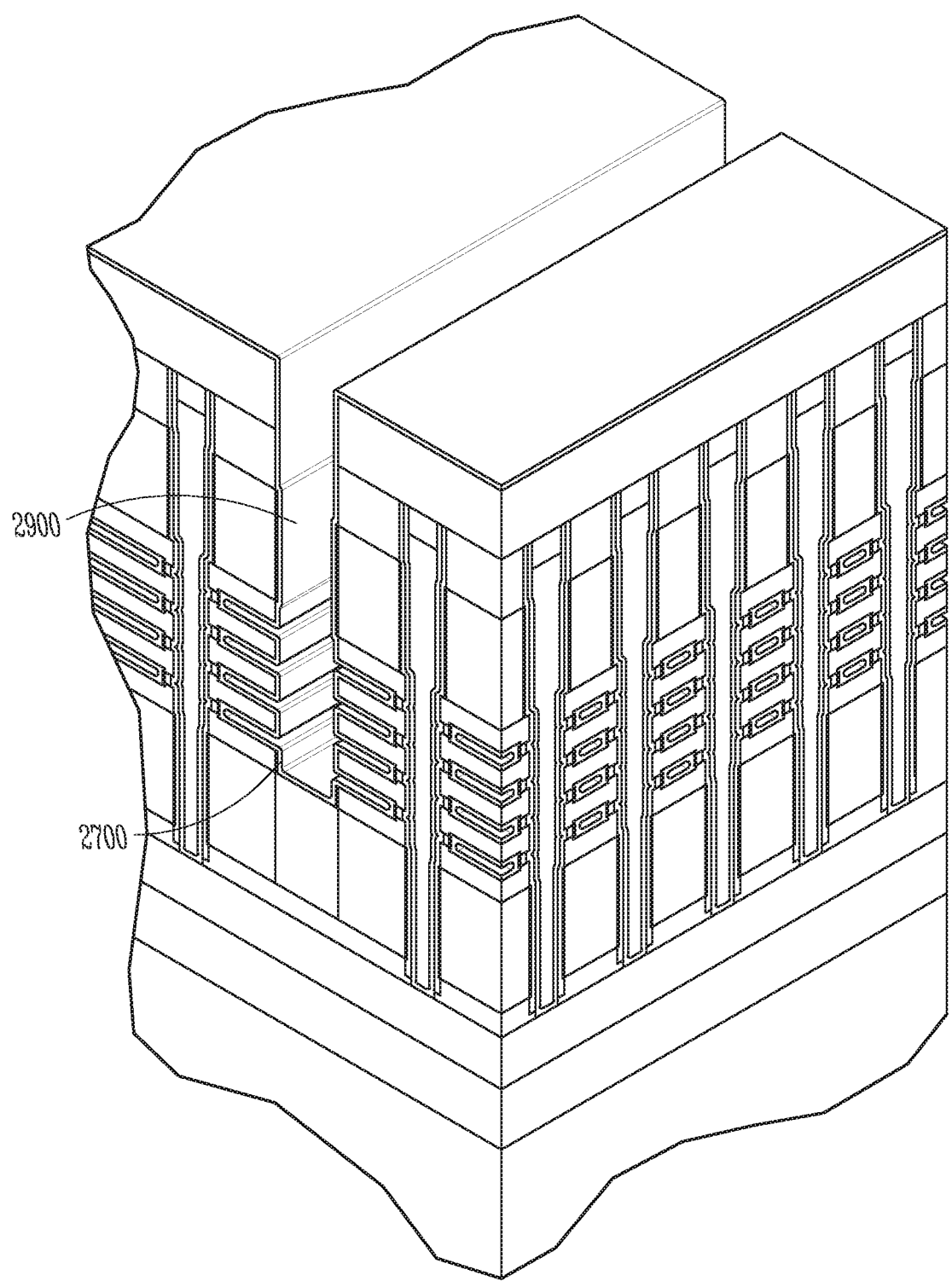

FIG. 29 depicts the structure of FIG. 28 after a nitride material 2900 is formed (e.g., deposited) over the sidewalls of the trenches as well as the sidewalls of the control gate recesses 2700.

Figure 30:
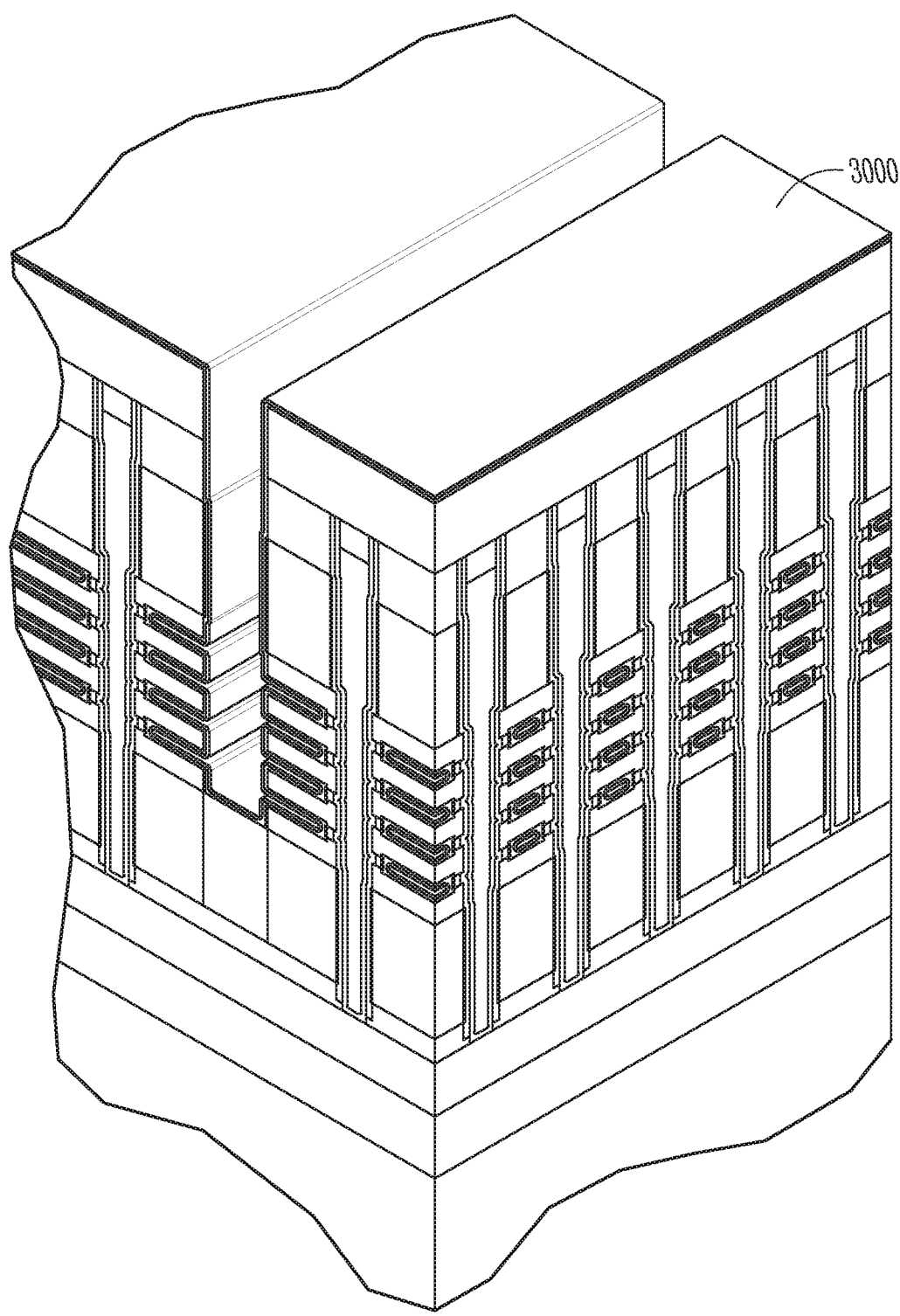

FIG. 30 depicts the structure of FIG. 29 after formation of a multi-component dielectric structure 3000 is formed (e.g., grown, deposited) over the nitride material 2900 of the trench sidewalls and sidewalls of the control gate recesses. The multi-component dielectric structure will preferably be an oxide-nitride-oxide (ONO) dielectric structure; and the dielectric structure will be formed adjacent to the floating gates in each tier, separating the subsequent control gate material from the floating gate (and in many cases extending above and below the control gate). The ONO dielectric is formed separately from the floating gate. The ONO dielectric preferably includes a relatively low leakage, high-K dielectric material (e.g., greater than 3.9). For example, the ONO dielectric may include $ZrO_2$, $HfO_2$, $Al_2O_3$, or mixtures of these oxides.

Figure 31:
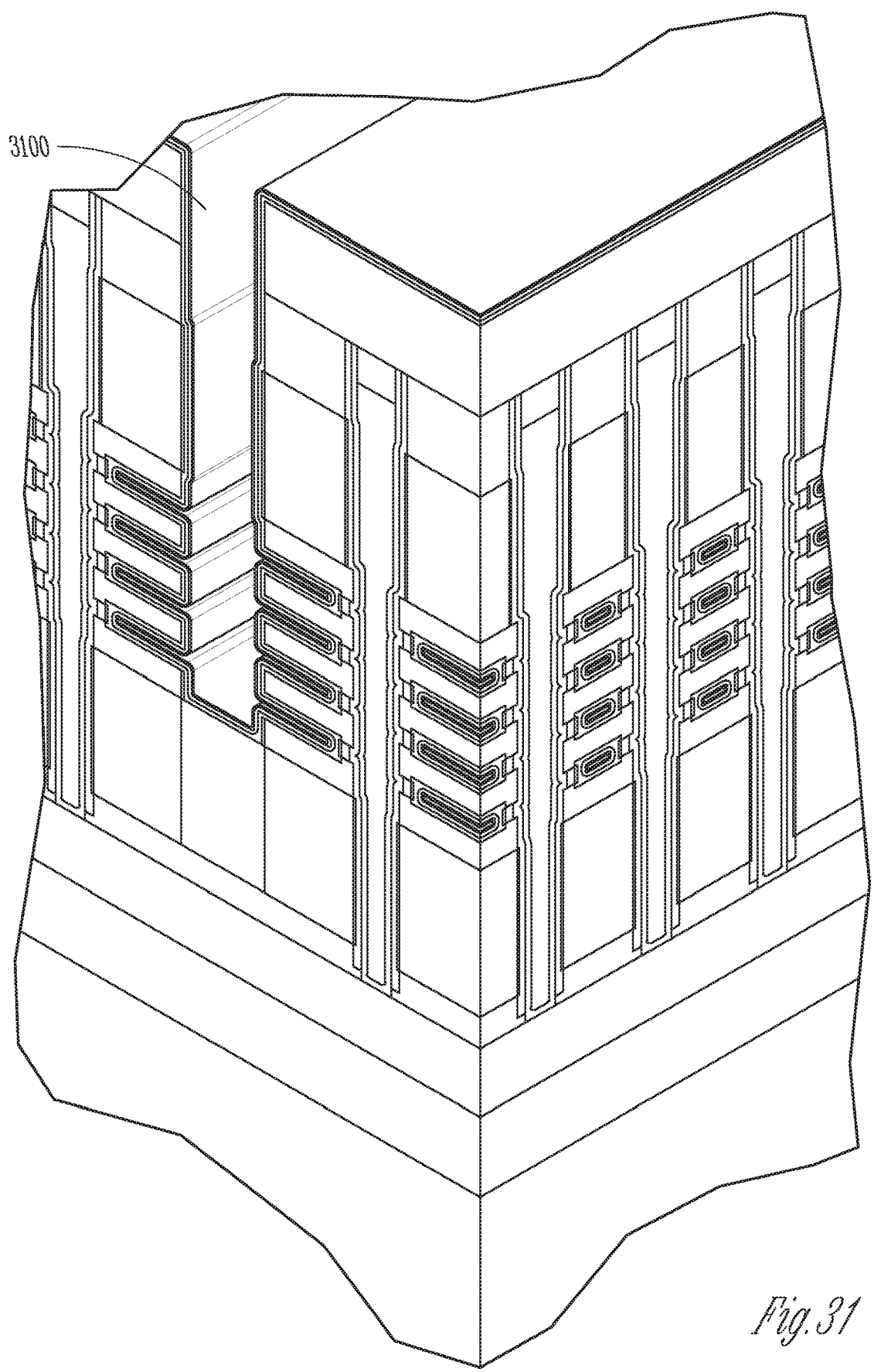

FIG. 31 depicts the structure of FIG. 29 after a metal liner material 3100 (e.g., titanium nitride (TiN), tungsten nitride (WN), tantalum nitride (TaN)) is formed (e.g., deposited) over the dielectric material 3000 of the trench sidewalls and the tier control gate recess sidewalls. In an embodiment, the metal liner material 3100 may be deposited by an atomic layer deposition (ALD) process to a depth of, for example, approximately 2-3 nm.

Figure 32:
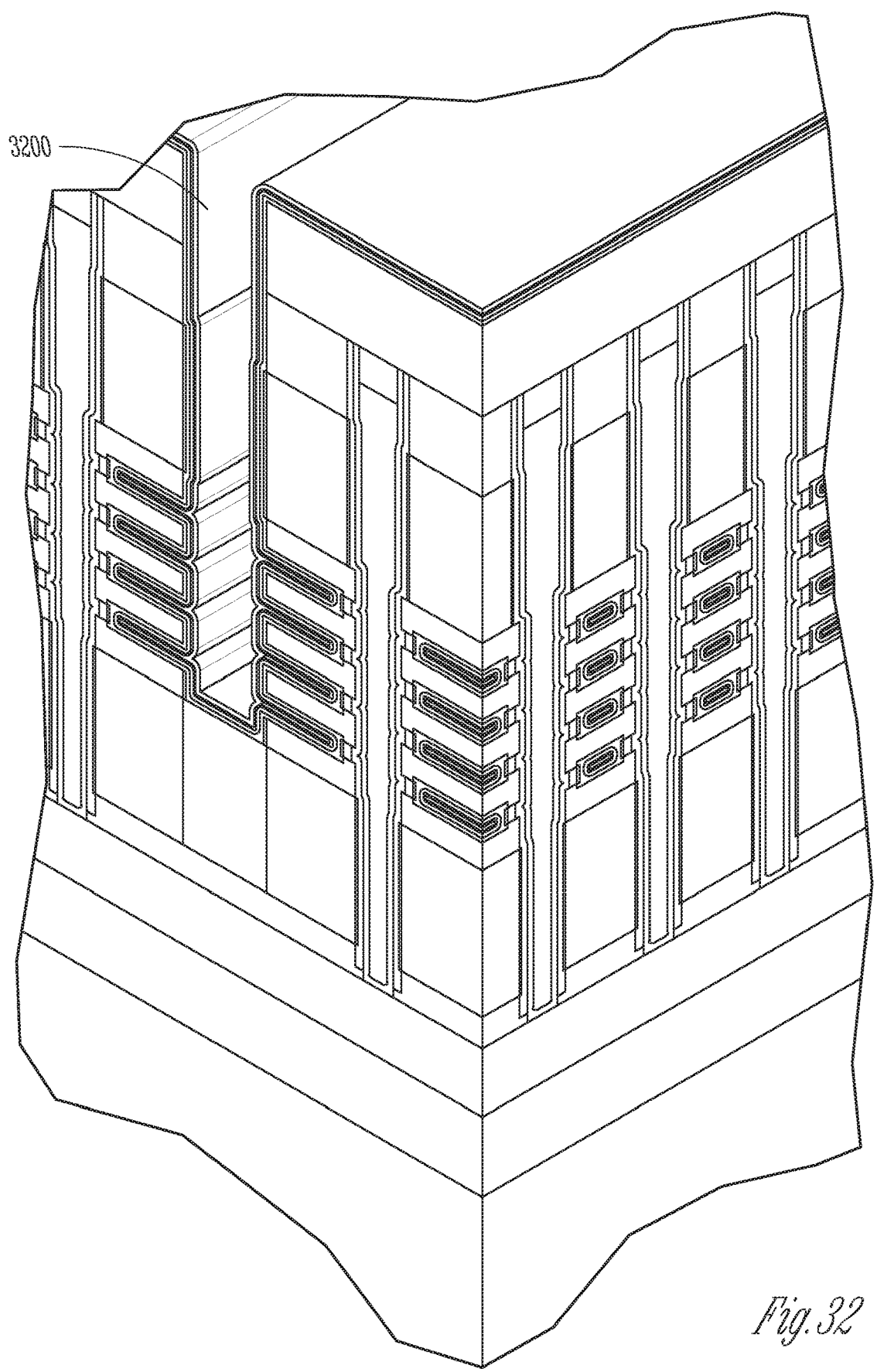

FIG. 32 depicts the structure of FIG. 29 after a control gate material 3200 (e.g., metal or polysilicon) is formed (e.g., deposited) over the metal material 3100 of the trench sidewalls and the tier opening sidewalls. In an embodiment, the control gate material 3200 may be deposited by an ALD process to a depth of a range of approximately 5-10 nm. If the control gate material is a doped polysilicon, the previous process of the metal liner material 3100 may not be performed. If the control gate material is a metal, the metal may be, for example, tungsten (W), titanium (Ti), tantalum (Ta), or other highly conductive metals. The metal liner material, when present, forms a portion of the control gate.

Figure 33:
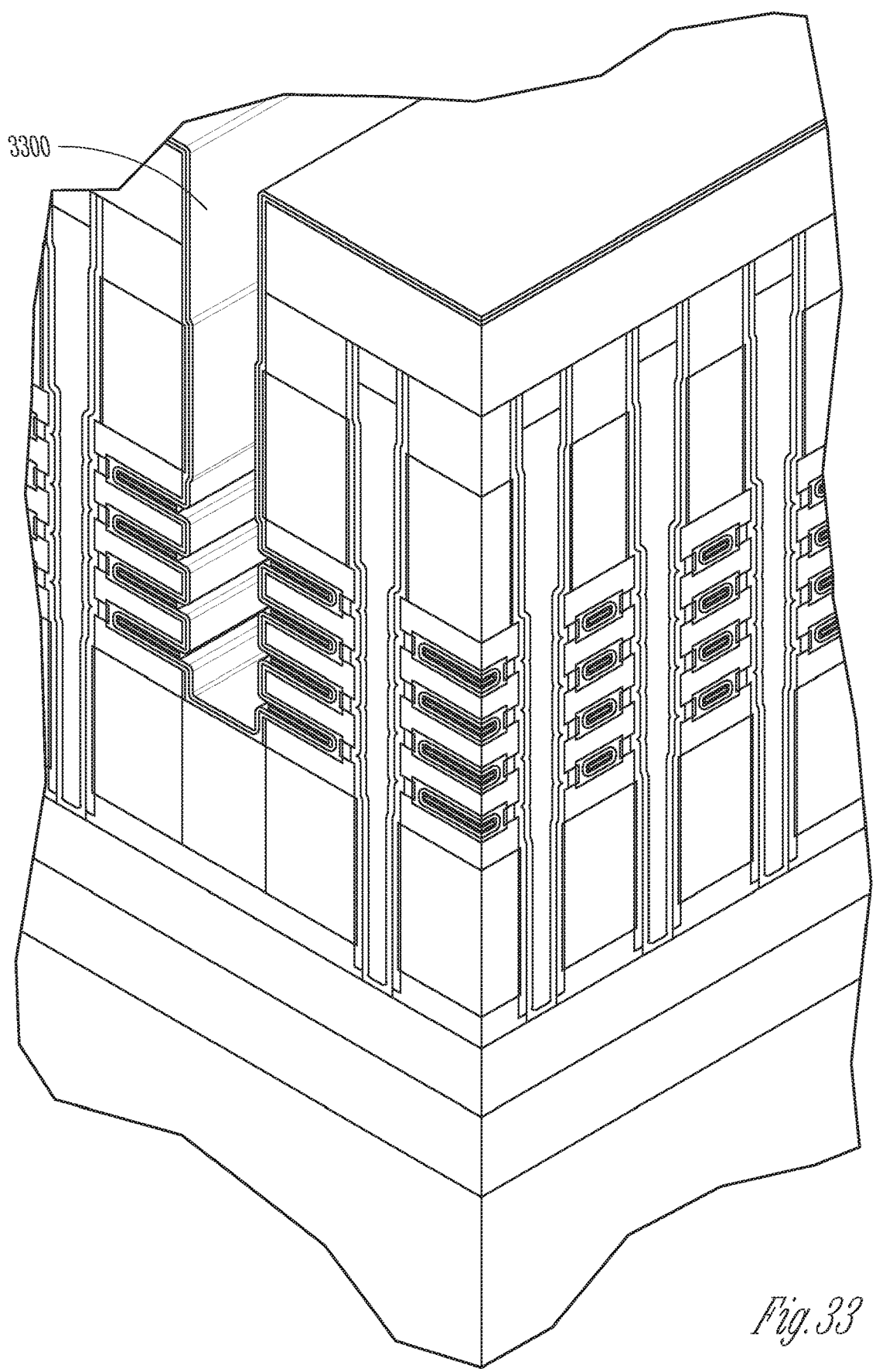

FIG. 33 depicts the structure of FIG. 29 after the metal material 3100 (e.g., TiN) and the control gate material 3200 (e.g., W) is removed (W is removed prior to TiN) from the sidewalls of the trenches to leave the metal material 3100 and the control gate material 3200 only in the tier openings to form the control gates 3300 (e.g., access lines, word lines) for the previously formed floating gates memory structure. An isotropic RIE etch process may be used to remove these materials 3100, 3200 from the trench sidewalls.

Figure 34:
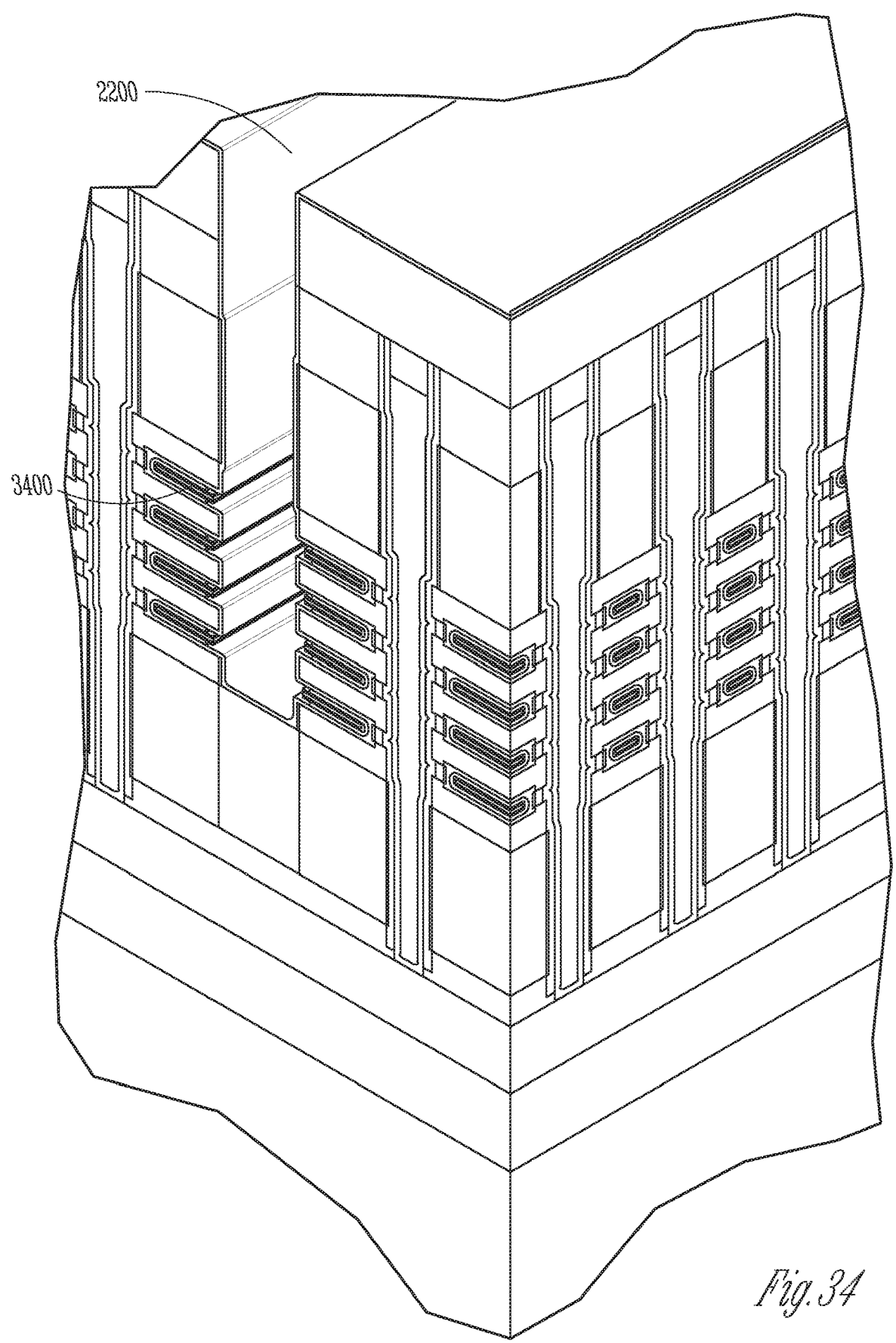

FIG. 34 depicts the structure of FIG. 29 after the previous dielectric material 3000 and nitride material 2900 are removed from the sidewalls of the trenches 2200 to provide individual access line separation. Thus, FIG. 34 shows that an access line 3400 extends into the page along the y-axis. Each of the individual access lines 3400 may then be coupled to addressing circuitry (not shown) in order to provide the voltages used during memory cell operation. The trenches are filled and planarized for subsequent back end metallization/interconnect processes. A dielectric material (e.g., oxide) may be used to fill the trenches.

Figure 35:
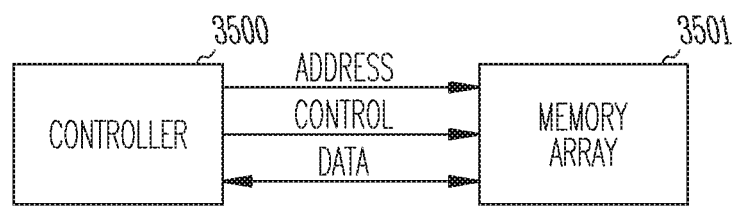
FIG. 35 illustrates a block diagram of an embodiment of a memory device, according to various embodiments.

FIG. 35 illustrates a block diagram of an embodiment of a system, in accordance with various embodiments. The system can include a controller 3500 (e.g., control circuitry, microprocessor) coupled to a memory array 3501 over address, control, and data buses. In one embodiment, the controller 3500 and memory array 3501 may be part of the same memory device. In another embodiment, the memory array 3501 is part of a memory device and the controller 3500 is a separate integrated circuit. The memory array 3501 may include vertical strings of memory cells with replacement control gates as described previously.

The above-described semiconductor fabrication flow for vertical strings of memory cells having replacement control gates may provide benefits over conventional vertical memory cell strings by decoupling the floating gate formation from the control gate formation, thereby reducing or eliminating residual nitride from sidewalls of the pillars to reduce undesirable electron trapping, eliminating flank nitride around the floating gates to reduce undesirable electron trapping and improve endurance, and/or reduce minimum cross-sectional diameter to benefit the program/erase $V_t$ window and efficiency in programming slope. Additional benefits may also be realized such as no ONO or oxynitride as a gate dielectric material on the SGS and SGD transistors, thus reducing $V_t$ degradation from cycling; a lower access line resistance if a metal control gate is used; and the potential for vertical scaling of the tiers with a shorter floating gate height. Additionally, with the described process flow, the vertical dimension of the control gate is not tied to that of the floating gate, thus further facilitating vertical scaling of the tiers. Tighter process control and, hence, cell device variability reduction may be achieved with the flow described here since the floating gate formation depends on only one process variable (e.g., tier nitride recess), as opposed to four process variables as used in the current state of the art practice.

An apparatus may be defined as circuitry, an integrated circuit die, a device, or a system.

Although specific embodiments have been illustrated and described herein, it will be appreciated by those of ordinary skill in the art that any arrangement that is calculated to achieve the same purpose may be substituted for the specific embodiments shown. Accordingly, many modifications and variations may be made in the structures and techniques described and illustrated herein without departing from the scope of the inventive subject matter. This application is intended to cover any adaptations or variations; and the scope of the inventive subject matter is to be determined by the scope of the following claims and all additional claims supported by the present disclosure, and all equivalents of such claims.

What is claimed is:

1. A method comprising:
   forming an opening extending through multiple tiers of dielectric tier material vertically separated, at least in part, by tiers of nitride tier material, and having a sidewall defined, at least in part, by such tiers;
   forming lateral recesses in the tiers of nitride tier material surrounding the opening;
   forming a charge storage structure material over the sidewall of the opening and in the recesses to form charge storage structures within the lateral recesses in the tiers of nitride tier material, the sidewall including a sidewall portion between the tiers of nitride tier material, and forming the charge storage material including forming a portion of the charge storage material over the sidewall portion between the tiers of nitride tier material;
   forming a dielectric material in the opening including forming a portion of the dielectric material over the sidewall portion between the tiers of nitride tier material, wherein forming the dielectric material comprises:
   oxidizing a portion of the charge storage material such that the oxidation consumes the portion of the charge storage material to form an oxide,
   removing the oxidized portion of the charge storage material leaving some charge storage material over the sidewalls of the opening, and
   oxidizing the remaining charge storage material over the sidewalls to form a tunnel oxide;
   forming pillar material over at least a portion of the dielectric material within the opening; and
   forming control gates, wherein the forming of the control gates comprises,
   removing at least portions of the nitride tier material to produce a respective control gate recess adjacent each of the charge storage structures;
   forming a dielectric structure in each of the control gate recesses, wherein the dielectric structures are formed separately from the charge storage structures; and
   forming a control gate in each of the control gate recesses, wherein each of the control gates is separated from an adjacent charge storage structure by a respective dielectric structure.

2. The method of claim 1, further comprising forming the tiers of dielectric tier material and nitride tier material over a tier of source select gate material.

3. The method of claim 2, wherein forming the dielectric material over the sidewall of the opening further comprises forming a gate dielectric material on a source select gate device.

4. The method of claim 2, wherein forming the dielectric material over the sidewall of the opening further comprises forming a gate dielectric material on a drain select gate device.

5. The method of claim 1, wherein multiple openings extending through the multiple tiers of dielectric tier material and tiers of nitride tier material are formed; wherein forming the control gates further comprises:
   forming a trench in the tiers of dielectric material and nitride material prior to removing the at least portions of the nitride tier material, wherein surfaces of the tiers of dielectric material and of the nitride material form at least a portion of the sidewalls defining the trench, and wherein the trench separates a first group of openings from a second group of openings;
   reducing a thickness of each of the dielectric material tiers to enlarge the control gate recesses;
   wherein forming the dielectric structure in the control gate recesses comprises, forming a first oxide material in the trench and in the control gate recesses adjacent the charge storage structures;
   forming a nitride material over the first oxide material; and
   forming a second oxide material over the nitride material; and
   wherein forming a control gate in each of the control gate recesses comprises forming a control gate material over the second oxide material.

6. The method of claim 5, further comprising removing the first oxide material, the nitride material, the second oxide material, and the control gate material from the sidewalk of the trench.

7. A method comprising:
   forming an opening extending through multiple tiers of dielectric tier material vertically separated, at least in part, by tiers of nitride tier material, and having a sidewall defined, at least in part, by such tiers;
   forming lateral recesses in the tiers of nitride tier material surrounding the opening;
   forming a charge storage structure material over the sidewall of the opening and in the recesses to form charge storage structures within the lateral recesses in the tiers of nitride tier material;
   forming a dielectric material over the sidewall of the opening;

forming pillar material over at least a portion of the dielectric material within the opening; and forming control gates, wherein the forming of the control gates comprises, removing at least portions of the nitride tier material to produce a respective control gate recess adjacent each of the charge storage structures;

forming a dielectric structure in each of the control gate recesses, wherein the dielectric structures are formed separately from the charge storage structures; and forming a control gate in each of the control gate recesses, wherein each of the control gates is separated from an adjacent charge storage structure by a respective dielectric structure, wherein forming the dielectric material over the sidewall of the opening comprises:

forming a sacrificial oxide from the charge storage material, wherein the sacrificial e consumes less than all of the charge storage material over the sidewall of the opening;

removing the sacrificial oxide from the sidewall; and oxidizing the remaining charge material over the sidewall to fort a tunnel oxide.

8. The method of claim 1, further comprising forming a drain select gate material over the tiers of dielectric tier material and nitride tier material.

9. The method of claim 1, wherein the charge storage structures are floating gates.

10. The method of claim 1, wherein the charge storage structures comprise polysilicon.

11. The method of claim 1, wherein the control gates comprise one or more of polysilicon, metal, and metal nano dots.

12. The method of claim 11, wherein the metal comprises tungsten, titanium, or tantalum.

13. A method comprising:

forming source select gate (SGS) material over a substrate;

forming interleaved tiers of dielectric material and nitride material over the SGS material;

forming drain select gate (SGD) material over the interleaved tiers of dielectric material and nitride material;

forming an opening through the SGD material, the interleaved tiers of dielectric material and nitride material, and the SGS material, the interleaved tiers and the SGS material forming at least a portion of a sidewall defining the opening;

forming a recess in the opening in each of the tiers of nitride material;

forming a floating gate material over the sidewall of the opening and the recesses to form a floating gate within each of the recesses, the sidewall including a sidewall portion between the tiers of nitride material, and forming the floating gate material including forming a portion of the floating gate material over the sidewall portion between the tiers of nitride material;

forming a dielectric over the sidewall including forming a portion of the dielectric over the sidewall portion between the tiers of nitride material, wherein forming dielectric over the sidewall comprises:

forming a sacrificial oxide over the floating gate material, wherein the sacrificial oxide consumes only a portion of thickness of the floating gate material over the sidewall and leaves portions of the floating gate material in the recesses, removing the sacrificial oxide, and oxidizing the remaining floating gate material over the sidewall to form a tunnel oxide over the sidewall and over remaining floating gate material in each recess;

forming a pillar material over the dielectric;

removing at least portions of the nitride material tiers to produce a control gate recess adjacent to each floating gate; and forming a control gate in each control gate recess wherein each control gate is separated from a respective floating gate by a dielectric structure.

14. The method of claim 13, further comprising forming a dielectric over the pillar material to fill a void within the pillar material.

15. The method of claim 14, further comprising:

forming a recess in a top of the pillar dielectric material such that a portion of the pillar material is exposed;

forming a plug material in the recess of the top of the pillar dielectric material; and forming a protective oxide over the drain select gate (SGD) material and the plug material.

16. The method of claim 14, wherein the dielectric structure comprises a multi-component dielectric structure that is formed separately and from the floating gate.

17. The method of claim 13, wherein forming the source select gate material over the substrate comprises:

forming a common source node material over the substrate;

forming an isolating dielectric material over the common source node material; and forming the source select gate material over the isolating dielectric material.

18. The method of claim 17, further comprising removing a portion of the isolating dielectric material from within the opening prior to forming the pillar material such that the pillar material contacts the common source node.

* * * * *